United States Patent
Babcock et al.

(10) Patent No.: US 8,183,621 B2
(45) Date of Patent: May 22, 2012

(54) NON-VOLATILE MEMORY CELL HAVING A HEATING ELEMENT AND A SUBSTRATE-BASED CONTROL GATE

(75) Inventors: Jeffrey A. Babcock, Sunnyvale, CA (US); Yuri Mirgorodski, Sunnyvale, CA (US); Natalia Lavrovskaya, Sunnyvale, CA (US); Saurabh Desai, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/037,199

(22) Filed: Feb. 28, 2011

(65) Prior Publication Data

US 2011/0147820 A1 Jun. 23, 2011

Related U.S. Application Data

(62) Division of application No. 11/729,710, filed on Mar. 29, 2007, now Pat. No. 7,919,807.

(51) Int. Cl.
*H01L 29/788* (2006.01)
*H01L 29/792* (2006.01)

(52) U.S. Cl. ......... 257/318; 257/315; 257/316; 257/324

(58) Field of Classification Search .................. 257/315, 257/316, 318, 324, 326, E29.129, E29.3, 257/E29.694
See application file for complete search history.

(56) References Cited

U.S. PATENT DOCUMENTS

| 4,698,787 | A | 10/1987 | Mukherjee et al. |
| 5,940,324 | A | 8/1999 | Chi et al. |
| 5,969,992 | A * | 10/1999 | Mehta et al. ............. 365/185.28 |
| 6,060,895 | A | 5/2000 | Soh et al. |
| 6,137,723 | A | 10/2000 | Bergemont et al. |
| 6,211,548 | B1 | 4/2001 | Ma |
| 6,992,927 | B1 | 1/2006 | Poplevine et al. |
| 7,463,517 | B2 * | 12/2008 | Shukuri et al. ............ 365/185.04 |
| 2004/0165457 | A1 * | 8/2004 | Park et al. ..................... 365/200 |

OTHER PUBLICATIONS

Babcock, J.A. et al., "Polysilicon Resistor Trimming for Packaged Integrated Circuits", IEDM, 1993, pp. 247-250.
Feldbaumer, David W. et al., "Pulse Current Trimming of Polysilicon Resistors", IEEE Transactions on Electron Devices, vol. 42, No. 4, 1995, pp. 689-696.
Babcock, J.A. et al., "Precision Electrical Trimming of Very Low TCR Poly-SiGe Resistors", IEEE Electron Device Letters, vol. 21, No. 6, 2000, pp. 283-285.
Feldbaumer, D.W. et al., "Theory and Application of Polysilicon Resistor Trimming", Solid-State Electronics, vol. 38, No. 11, 1995, pp. 1861-1869.

* cited by examiner

*Primary Examiner* — Hung Vu
(74) *Attorney, Agent, or Firm* — Wade J. Brady, III; Frederick J. Telecky, Jr.

(57) ABSTRACT

The number of times that a non-volatile memory (NVM) can be programmed and erased is substantially increased by utilizing a localized heating element that anneals the oxide that is damaged by tunneling charge carriers when the NVM is programmed and erased. The program and erase voltages are also reduced when heat from the heating element is applied prior to programming and erasing.

19 Claims, 14 Drawing Sheets

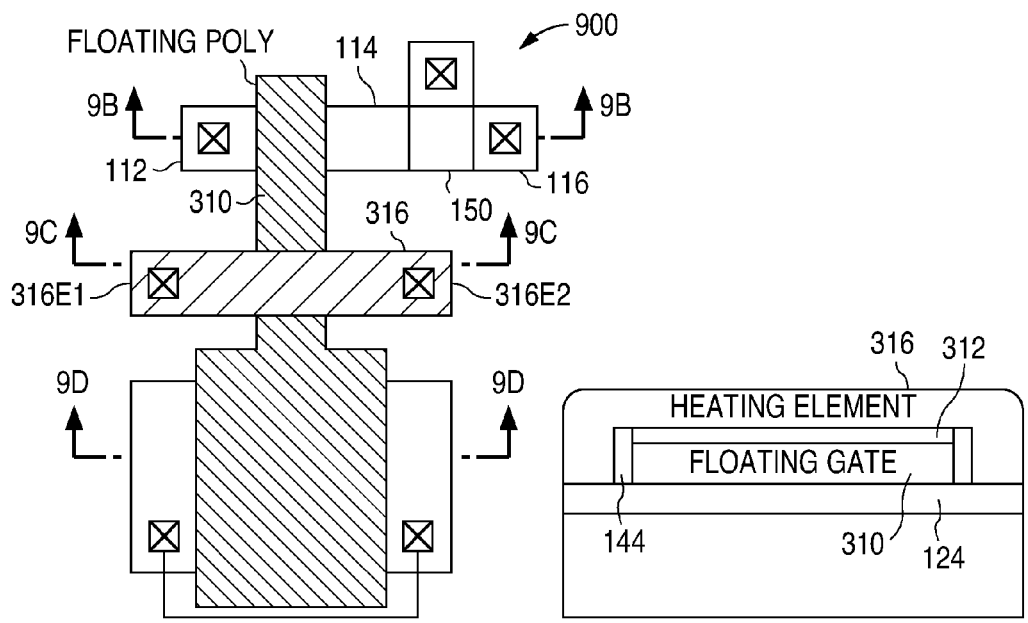
FIG. 9A
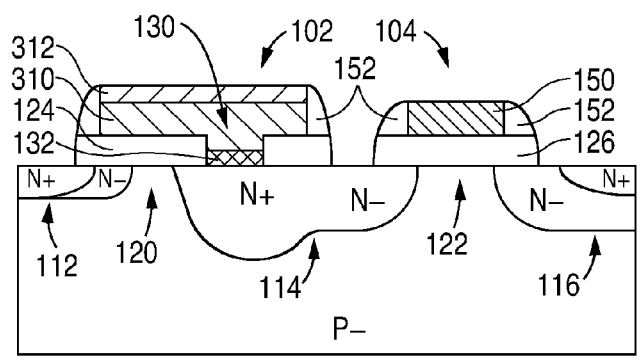
FIG. 9C
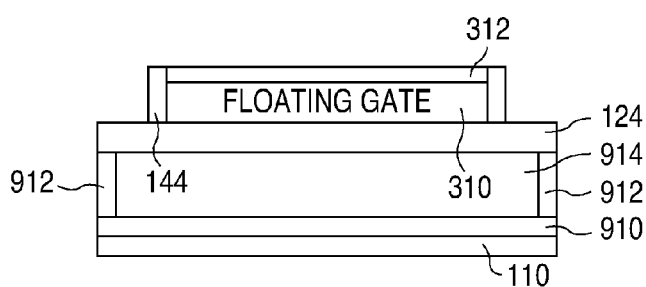
FIG. 9B
FIG. 9D

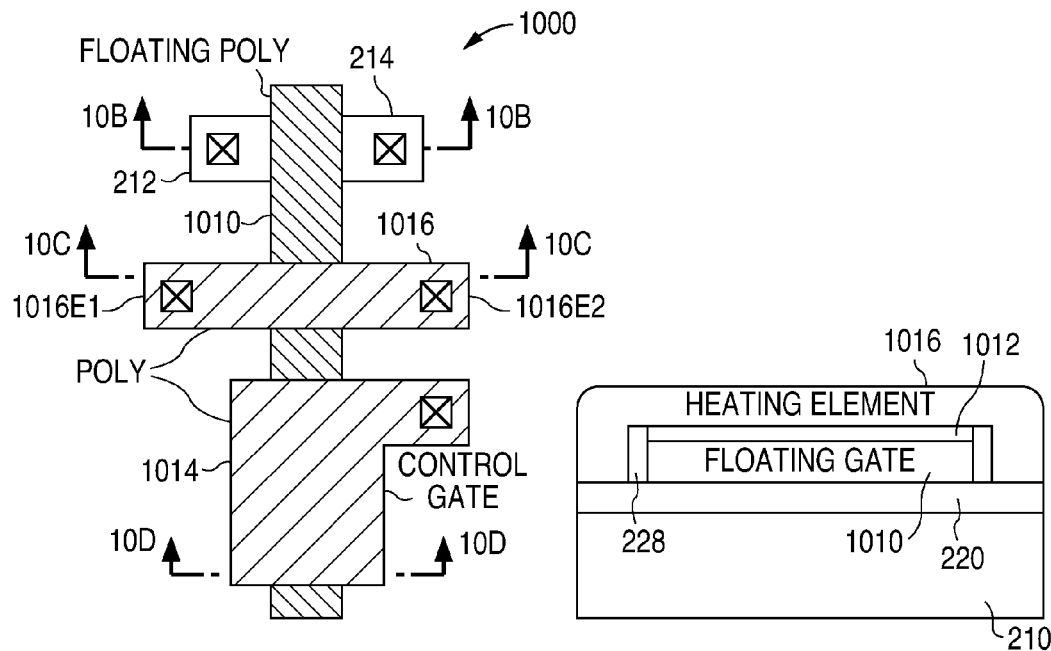
FIG. 10A
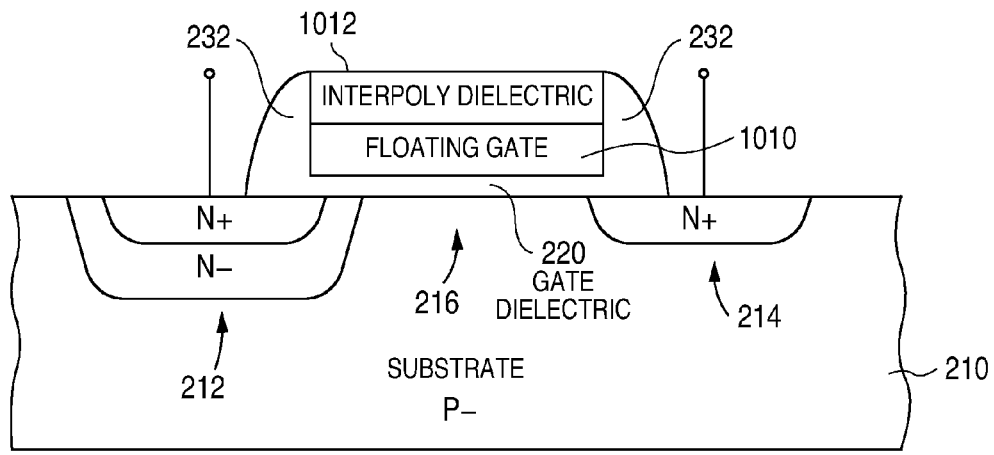
FIG. 10B
FIG. 10C
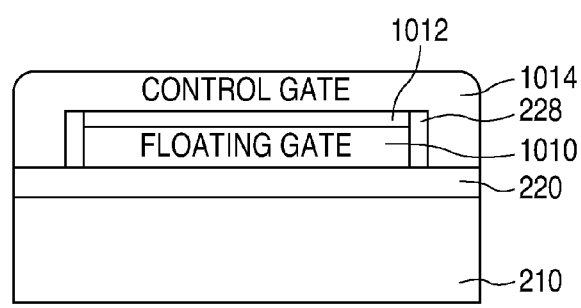
FIG. 10D

FIG. 13A  FIG. 13C

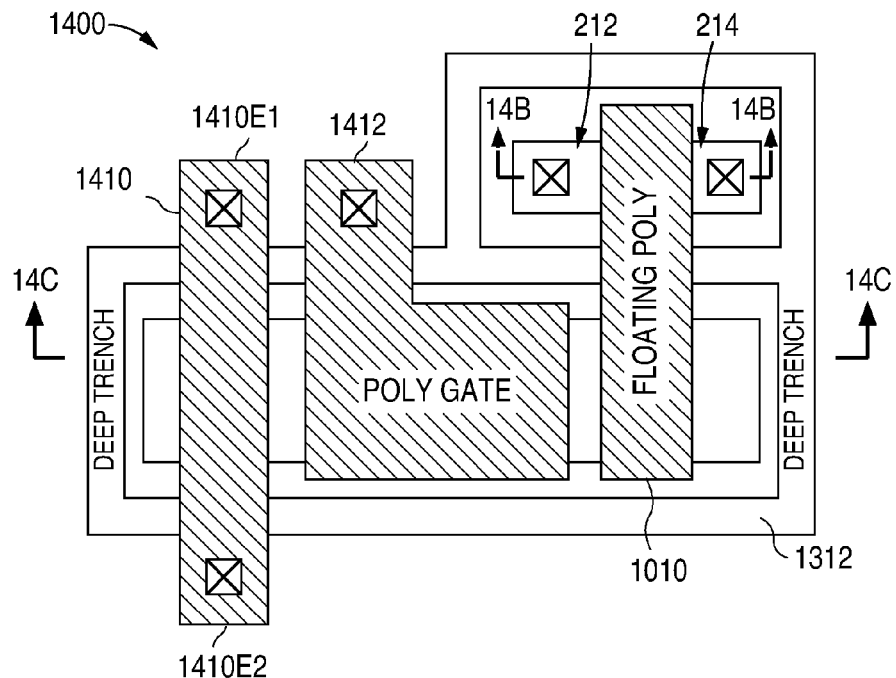
FIG. 14A
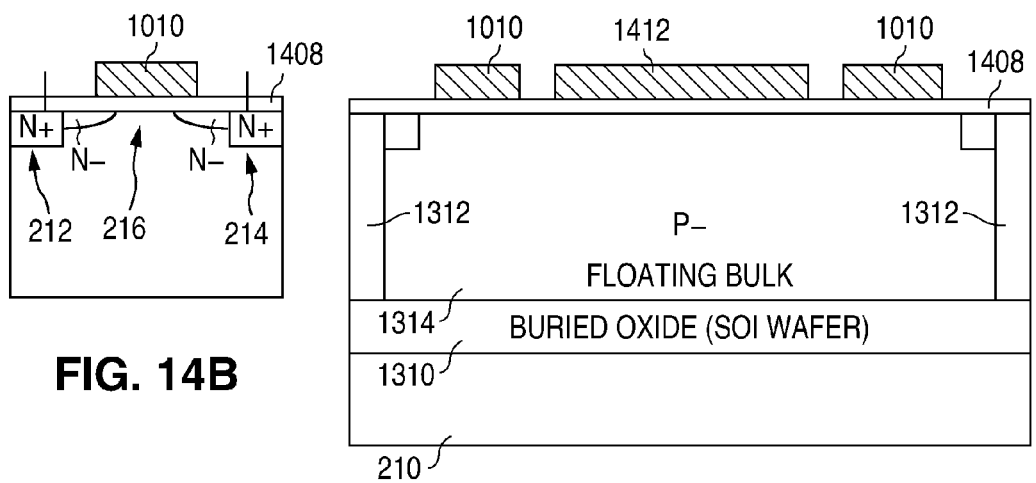
FIG. 14B
FIG. 14C

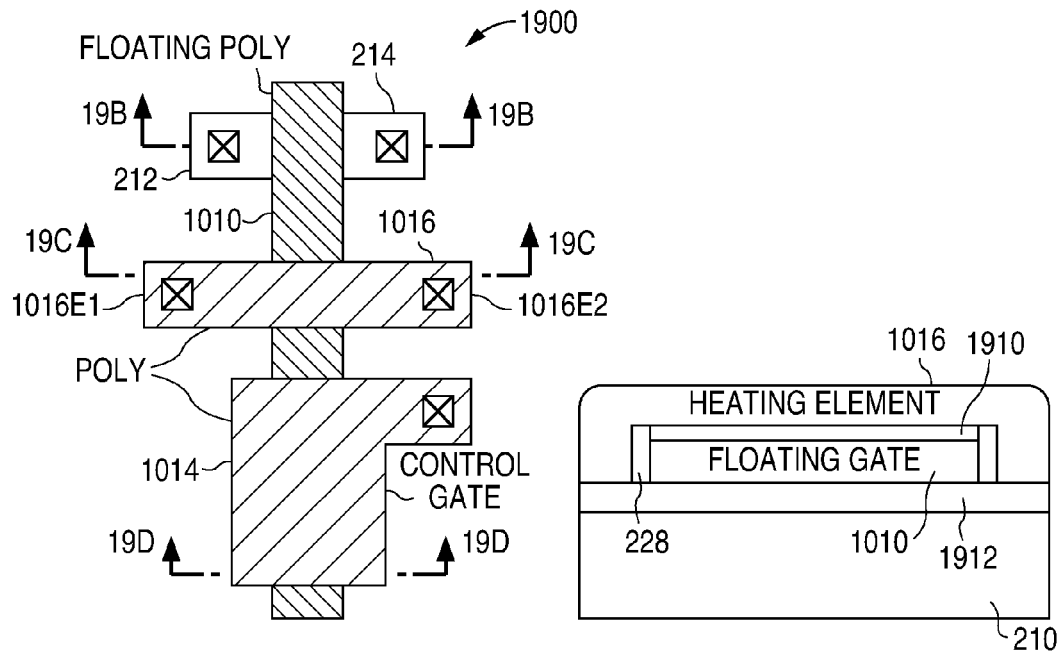
FIG. 19A
FIG. 19C
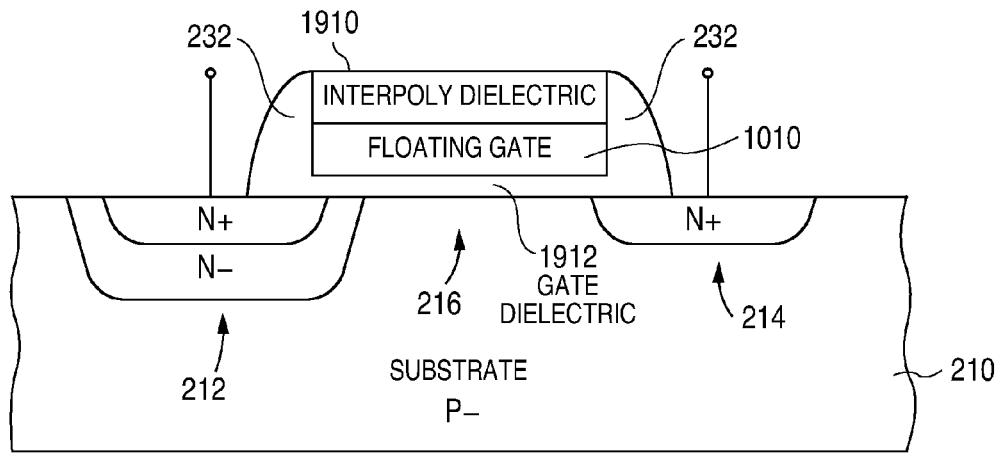
FIG. 19B
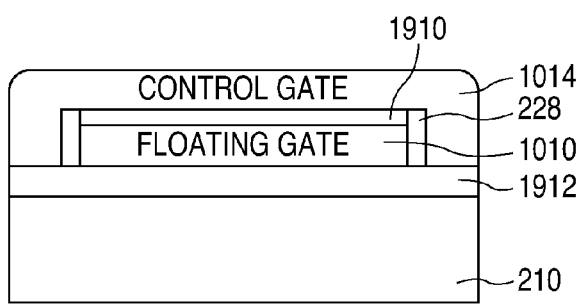
FIG. 19D

NON-VOLATILE MEMORY CELL HAVING A HEATING ELEMENT AND A SUBSTRATE-BASED CONTROL GATE

This is a divisional application of application Ser. No. 11/729,710 filed on Mar. 29, 2007 now U.S. Pat. No. 7,919,807 by Jeffrey A. Babcock et al.

BACKGROUND OF THE INVENTION

1. Field of the Invention

The present invention relates to non-volatile memory (NVM) cells and, more particularly, to an NVM cell with a heating element.

2. Description of the Related Art

A non-volatile memory is a semiconductor memory that retains data stored in the memory after power to the memory has been removed. Three well-known non-volatile memories include electrically programmable read-only-memories (EPROMS), electrically erasable programmable read-only-memories (EEPROMS), and flash EPROMS.

The three types of memories are similar in structure (with each memory having an MOS-type structure that utilizes a floating gate and a control gate in lieu of a single conventional gate), but differ in the way the memories are programmed and erased. EPROMS are programmed by a process known as hot electron injection, and are erased by exposure to ultraviolet (UV) light. EEPROMS are programmed and erased electrically by a process known as Fowler-Nordheim tunneling. Flash EPROMS, in turn, are a combination, being programmed by hot electron injection, and erased by Fowler-Nordheim tunneling.

One well-known type of EEPROM is a floating-gate tunneling-oxide (FLOTOX) EEPROM. FIGS. 1A-1C show views that illustrate a prior-art FLOTOX EEPROM cell 100. FIG. 1A shows a plan view, while FIGS. 1B and 1C show cross-sectional views taken along lines 1B-1B and 1C-1C, respectively, in FIG. 1A.

As shown in FIGS. 1A-1C, FLOTOX EEPROM cell 100 includes an EEPROM 102 which retains data, and an access transistor 104 which controls access to EEPROM 102. (Whenever two or more EEPROMS share a common drain line and are separately erasable, each EEPROM requires an access transistor due to the high drain voltages that are used during erase.)

In addition, FLOTOX EEPROM cell 100, which utilizes a conventionally-formed, p-single-crystal silicon semiconductor material 110, further includes spaced-apart n-type doped regions 112, 114, and 116 that are formed in p-semiconductor material 110. As shown, the doped regions 112, 114, and 116 each have a heavily-doped region (N+) and a lightly-doped region (N−).

Doped regions 112 and 114 form the source and drain regions of EEPROM 102, while doped regions 114 and 116 form the source and drain regions of access transistor 104. Thus, doped region 114 is a shared region which functions as the drain of EEPROM 102 and the source of access transistor 104.

Further, FLOTOX EEPROM cell 100 also includes a first channel region 120 of p-semiconductor material 110 that lies between and contacts doped regions 112 and 114, and a second channel region 122 of p-semiconductor material 110 that lies between and contacts doped regions 114 and 116.

FLOTOX EEPROM cell 100 additionally includes a first gate isolation region 124 that contacts the top surface of p-semiconductor material 110 over first channel region 120, and a second gate isolation region 126 that contacts the top surface of p-semiconductor material 110 over second channel region 122. Cell 100 also includes a tunnel window 130 in first gate isolation region 124 that exposes a portion of doped region 114, and a thin tunnel oxide region 132 that contacts doped region 114 in tunnel window 130.

As further shown in FIGS. 1A-1C, FLOTOX EEPROM cell 100 includes a floating gate 140 that contacts first gate isolation region 124 and tunnel oxide region 132, and an interpoly dielectric 142 (e.g., oxide-nitride-oxide) that contacts floating gate 140. Cell 100 also includes an edge oxide 144 that contacts opposing side walls of floating gate 140, and a control gate 146 that contacts interpoly dielectric 142. Thus, floating gate 140 lies over and is insulated from first channel region 120, and control gate 146 lies over and is insulated from floating gate 140. Cell 100 additionally includes an access gate 150 that lies over and is insulated from second channel region 122 by second gate isolation region 126, and non-conductive side wall spacers 152.

In operation, cell 100 is programmed by applying a program voltage, such as +12V, to control gate 146 and an access voltage, such as +3.3V, to access gate 150 while grounding doped region 116 and floating doped region 112. Under these bias conditions, electrons from doped region 114 tunnel through tunnel oxide region 132 by way of the Fowler-Nordheim tunneling mechanism, and begin accumulating on floating gate 140 where the increased negative charge raises the threshold voltage of the cell.

Cell 100 is erased by applying the access voltage to access gate 150 and an erase voltage, such as +12V, to doped region 116 while grounding control gate 146 and floating doped region 112. Under these bias conditions, electrons from floating gate 140 tunnel back through tunnel oxide region 132 to doped region 114 where the reduced negative charge on floating gate 140 lowers the threshold voltage of the cell. (The thickness of first gate isolation region 124 and the magnitudes of the program and erase voltages are selected so that Fowler-Nordheim tunneling does not occur through first gate isolation region 124.)

Once programmed or erased, cell 100 is read by applying a first read voltage, such as +3.3V, to control gate 146, the access voltage to access gate 150, and a second read voltage, such as +3.3V, to doped region 116 while grounding doped region 112. When cell 100 is erased, a large current flows from doped region 116 to doped region 114 to doped region 112 due to the lower threshold voltage of an erased cell, while a much smaller current or no current at all flows from doped region 116 to doped region 114 to doped region 112 when cell 100 is programmed due to the higher threshold voltage of a programmed cell.

FIGS. 2A-2C show views that illustrate a prior-art flash EPROM 200. FIG. 2A shows a plan view, while FIGS. 2B and 2C show cross-sectional views taken along lines 2B-2B and 2C-2C, respectively, in FIG. 2A. As shown in FIGS. 2A-2C, flash EPROM 200, which utilizes a conventionally-formed, p-single-crystal silicon semiconductor material 210, includes spaced-apart n-type doped regions 212 and 214 that are formed in p-semiconductor material 210. As shown, doped region 212, which functions as the source region, has a heavily-doped region (N+) and a lightly-doped region (N−), while doped region 214, which functions as the drain region, has a heavily-doped region (N+).

Further, flash EPROM 200 also includes a channel region 216 of p-semiconductor material 210 that lies between and contacts doped regions 212 and 214, and a gate dielectric 220 that contacts the top surface of p-semiconductor material 210 over channel region 216. In flash EPROM 200, the thickness of gate dielectric 220 is comparable to the thickness of thin tunnel oxide region 132.

As further shown in FIGS. 2A-2C, flash EPROM 200 includes a floating gate 222 that contacts gate dielectric 220, and an interpoly dielectric 224 (e.g., oxide-nitride-oxide) that contacts floating gate 222. Flash EPROM 200 also includes an edge oxide 228 that contacts opposing side walls of floating gate 222, and a control gate 230 that contacts interpoly dielectric 224. Floating gate 222 lies over and is insulated from channel region 216, and control gate 230 lies over and is insulated from floating gate 222. Flash EPROM 200 additionally includes non-conductive side wall spacers 232.

In operation, flash EPROM 200 is programmed by applying a programming voltage to control gate 230, a drain voltage to drain region 214, and ground to source region 212. The programming voltage applied to control gate 230 induces a positive potential on floating gate 222 which, in turn, attracts electrons to the surface of channel region 216 to form a channel 234.

In addition, the source-to-drain voltage sets up an electric field which causes electrons to flow from source region 212 to drain region 214 via channel 234. As the electrons flow to drain region 214, the electric field, which has a maximum near drain region 214, accelerates these electrons into having ionizing collisions that form channel hot electrons near drain region 214.

A small percentage of the channel hot electrons are then injected onto floating gate 222 via gate dielectric 220. Flash EPROM 200 is programmed when the number of electrons injected onto floating gate 222 is sufficient to prevent channel 234 from being formed when a read voltage is subsequently applied to control gate 230.

Flash EPROM 200 is erased by applying an erase voltage, such as +12V, to doped region 212 while grounding control gate 230 and floating doped region 214. The graded N+/N− junction of doped region 212 prevents junction breakdown. Under these bias conditions, electrons from floating gate 222 tunnel through gate dielectric 220 to doped region 212 where the reduced negative charge on floating gate 222 lowers the threshold voltage of EPROM 200.

In a flash EPROM array, because flash EPROMS do not utilize an access transistor, all of the flash EPROMS in the array are electrically erased at the same time in a single operation. (Large arrays can be broken into subarrays with select transistors where all of the flash EPROMS in the subarray are erased at the same time.) Thus, flash EPROMS are much smaller than EEPROM cells (one transistor versus two transistors), but can not be individually erased without access transistors.

Once programmed or erased, flash EPROM 200 is read by applying a first read voltage, such as +3.3V, to control gate 230, and a second read voltage, such as +3.3V, to doped region 214 while grounding doped region 212. When flash EPROM 200 is erased, a large current flows from doped region 214 to doped region 212 due to the lower threshold voltage of an erased flash EPROM, while a much smaller current or no current at all flows from doped region 214 to doped region 212 when flash EPROM 200 is programmed due to the higher threshold voltage of a programmed flash EPROM.

One problem with EEPROM cell 100 and flash EPROM 200 is that EEPROM cell 100 and flash EPROM 200 can only be programmed and erased a limited number of times before failing. The movement of electrons back and forth through tunnel oxide region 132 and gate dielectric 220 while programming and erasing damages the thin oxide and leads to the formation of traps which, in turn, provide a leakage path for the charge stored on the floating gate.

For example, current-generation EEPROM cells typically provide 1,000,000 erase-program cycles before failure, while current-generation flash EPROMS typically provide 10,000 erase-program cycles. Flash EPROMS tend to wear out quicker than EEPROM cells because only select cells need be erased in an EEPROM array, whereas all of the EPROMS in a flash array (or subarray) are erased during each erase cycle.

Although these numbers of erase-program cycles are sufficient for many applications, there is a need for a non-volatile memory that provides a substantially larger number of erase-program cycles.

BRIEF DESCRIPTION OF THE DRAWINGS

FIG. 1A is a plan view, while FIGS. 1B and 1C are cross-sectional views taken along lines 1B-1B and 1C-1C, respectively, in FIG. 1A.

FIG. 2A is a plan view, while FIGS. 2B and 2C are cross-sectional views taken along lines 2B-2B and 2C-2C, respectively, in FIG. 2A.

FIG. 3A is a plan view, while FIGS. 3B and 3C are cross-sectional views taken along lines 3B-3B and 3C-3C of FIG. 3A.

FIGS. 9A-9D are views illustrating an example of a FLOTOX EEPROM cell 900, which represents a second embodiment of an NVM in accordance with the present invention. FIG. 9A is a plan view, while FIGS. 9B, 9C, and 9D are cross-sectional views taken along lines 9B-9B, 9C-9C, and 9D-9D of FIG. 9A.

FIGS. 10A-10D are views illustrating an example of a flash EPROM cell 1000, which represents a third embodiment of an NVM in accordance with the present invention. FIG. 10A is a plan view, while FIGS. 10B, 10C, and 10D are cross-sectional views taken along lines 10B-10B, 10C-10C, and 10D-10D of FIG. 10A.

FIGS. 13A-13D are views illustrating an example of a flash EPROM 1300, which represents a fourth embodiment of an NVM in accordance with the present invention. FIG. 13A is a plan view, while FIGS. 13B, 13C, and 13D are cross-sectional views taken along lines 13B-13B, 13C-13C, and 13D-13D of FIG. 13A.

FIGS. 14A-14C are views illustrating an example of an EEPROM 1400, which represents a fifth embodiment of an NVM in accordance with the present invention. FIG. 14A is a plan view, while FIGS. 14B and 14C are cross-sectional views taken along lines 14B-14B and 14C-14C of FIG. 14A.

FIGS. 19A-19D are views illustrating an example of an EPROM 1900, which represents a sixth embodiment of an NVM in accordance with the present invention.

DETAILED DESCRIPTION OF THE INVENTION

As described in greater detail below, the present invention substantially increases the number of times that a non-volatile memory (NVM) can be programmed and erased by utilizing a localized heating element that anneals the tunnel/thin gate dielectric after the NVM has been programmed or erased. In addition, the localized heating element can also be used to reduce the programming voltage and improve the charge injection rate to control the programming and erasing of the NVM.

Figure 1A:
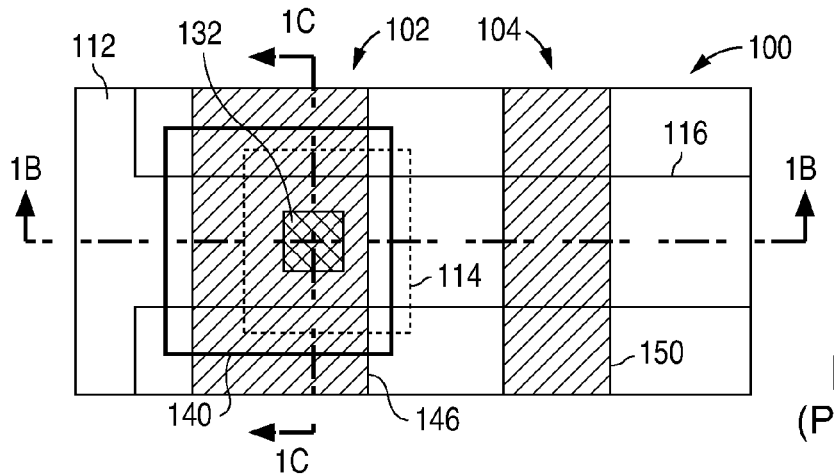
FIGS. 1A-1C are views illustrating a prior-art FLOTOX EEPROM cell 100.
Figure 1B:
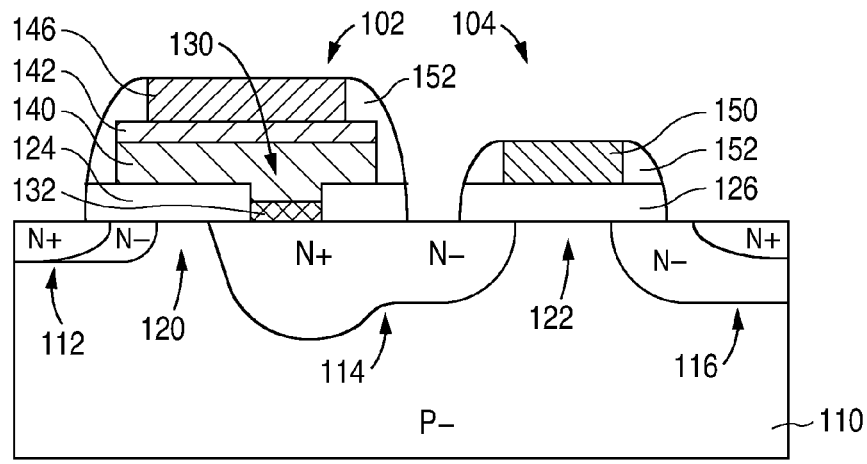
Figure 1C:
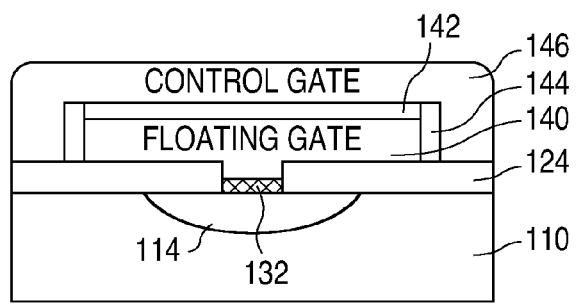
Figure 2A:
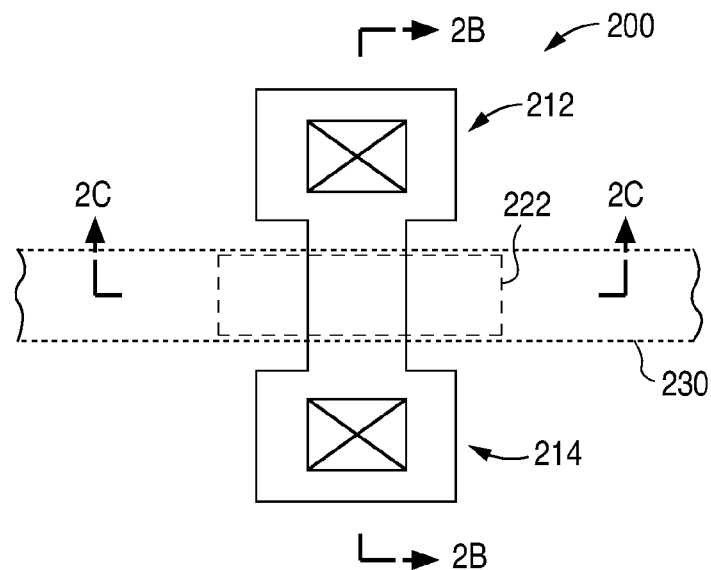
FIGS. 2A-2C are views illustrating a prior-art flash EPROM 200.
Figure 2B:
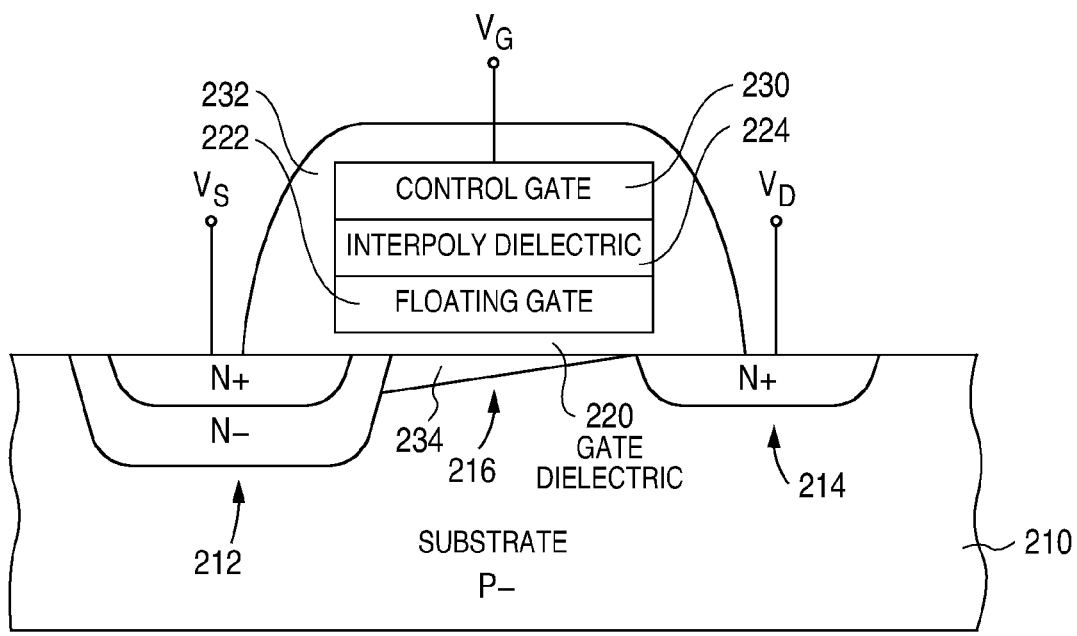
Figure 2C:
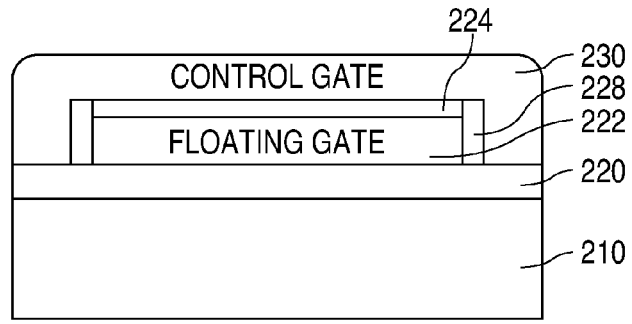
Figure 3A:
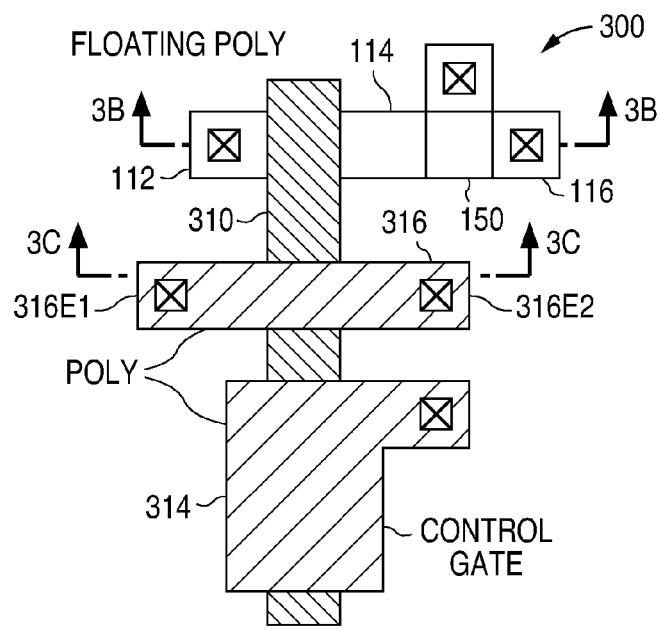
FIGS. 3A-3C are views illustrating an example of a non-volatile memory (NVM) cell 300 in accordance with the present invention.
Figure 3B:
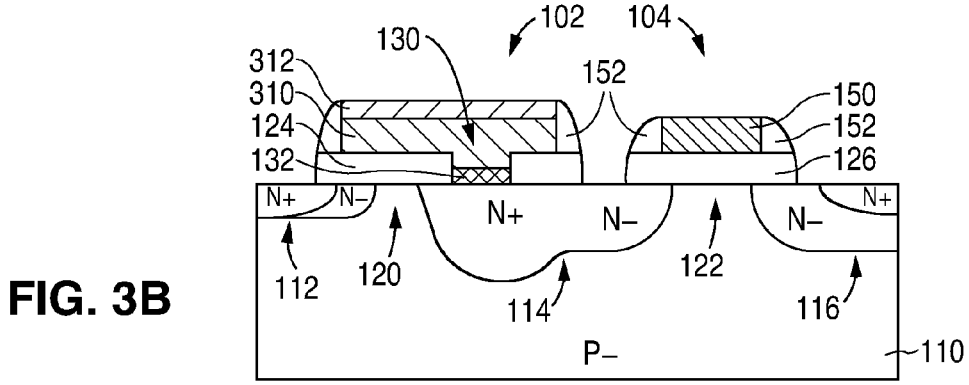
Figure 3C:
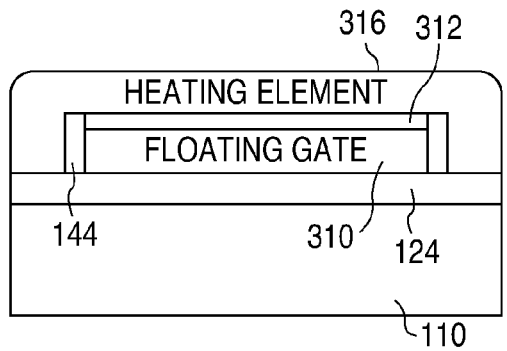

FIGS. 3A-3C shows views that illustrate an example of a FLOTOX EEPROM cell 300, which represents a first embodiment of an NVM in accordance with the present invention. FLOTOX EEPROM cell 300 is similar to FLOTOX EEPROM cell 100 and, as a result, utilizes the same reference numerals to designate the structures which are common to both EEPROMS.

FLOTOX EEPROM cell 300 differs from FLOTOX EEPROM cell 100 in that cell 300 includes a floating gate 310 that extends out over and is insulated from p-semiconductor material 110, and an interpoly dielectric 312 that contacts the top surface of floating gate 310. Floating gate 310, which is conductive, is electrically isolated from all other conductive structures.

In addition, cell 300 includes a control gate 314 that lies over and is insulated from floating gate 310 by interpoly dielectric 312 such that control gate 314 does not lie directly over any portion of first channel region 120. Floating gate 310 and control gate 314, which is conductive, can be implemented with, for example, polysilicon.

In accordance with the present invention, FLOTOX EEPROM cell 300 also includes a heating element 316 that is thermally coupled to thin tunnel oxide region 132 to generate heat that falls within a temperature range that is sufficient to anneal thin tunnel oxide region 132. Heating element 316, which lies over and is insulated from floating gate 310 by interpoly dielectric 312, has a first end 316E1 and an opposing second end 316E2. Further, heating element 316, which lies below the lowest metal trace, can be implemented as a doped strip of polysilicon, single-crystal silicon, or other material which generates heat when a current is passed through the material.

Cell 300 is formed following the same fabrication sequence that is used to form prior-art cell 100, except that floating gate 310 is longer, and the mask which is formed and patterned on a second layer of polysilicon (poly2) to define control gate 314 is also patterned to define heating element 316. Thus, when the poly2 layer is etched to form control gate 314, heating element 316 is also formed at the same time.

Figure 4:
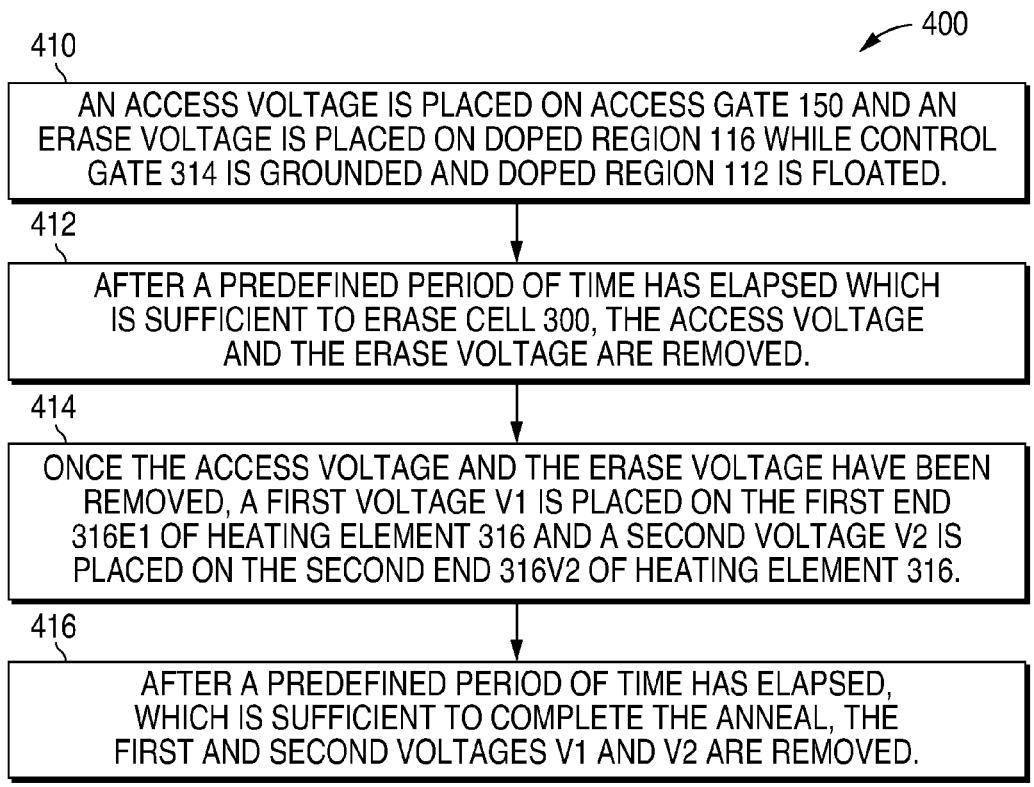
FIG. 4 is a flow chart illustrating an example of a method 400 of erasing FLOTOX EEPROM cell 300 in accordance with the present invention.

FIG. 4 shows a flow chart that illustrates an example of a method 400 of erasing FLOTOX EEPROM cell 300 in accordance with the present invention. As shown in FIG. 4, method 400 begins in 410 by placing an access voltage, such as +3.3V, on access gate 150 and an erase voltage, such as +12V, on doped region 116 while grounding control gate 314 and floating doped region 112.

Under these bias conditions, electrons from floating gate 310 tunnel through tunnel oxide region 132 to doped region 114 where the reduced negative charge on floating gate 310 lowers the threshold voltage of the cell. Method 400 next moves to 412 where, after a predefined period of time has elapsed which is sufficient to erase cell 300, the access voltage and the erase voltage is removed.

Following this, method 400 moves to 414 where, once the access voltage and the erase voltage has been removed, a first voltage V1 is placed on the first end 316E1 of heating element 316 and a second voltage V2 is placed on the second end 316E2 of heating element 316. The difference in voltage V1−V2 induces a current to flow through heating element 316 which generates heat as the current density is increased.

Figure 5:
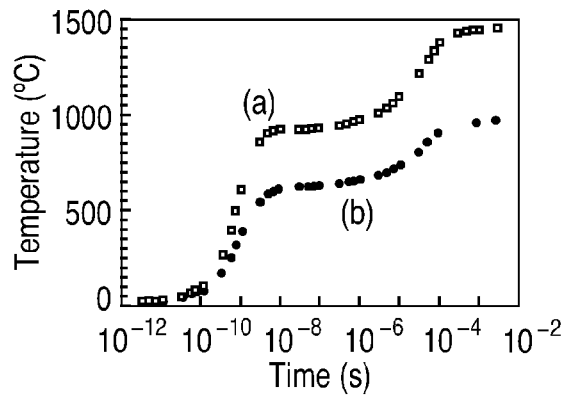
FIG. 5 is a graph illustrating temperature versus time in accordance with the present invention.

FIG. 5 shows a graph that illustrates temperature versus time in accordance with the present invention. Measurements are shown for two power densities: (a) 8.38 MW/cm3 and (b) 5.64 MW/cm3. As shown in FIG. 5, very high temperatures are reached within heating element 316 within milliseconds to tens of milliseconds. The heat is thermally coupled to thin tunnel oxide region 132, causing the temperature of tunnel oxide region 132 to rise significantly. The sharply increased temperature anneals tunnel oxide region 132 which, in turn, repairs the damage that was caused by charge carriers (electrons) tunneling through tunnel oxide region 132 during erasure.

After a predefined period of time has elapsed, which is sufficient to complete the anneal, the first and second voltages V1 and V2 are removed. The removal of the first and second voltages V1 and V2 stops the current from flowing through heating element 316 which, in turn, removes the source of heat.

Figure 6:
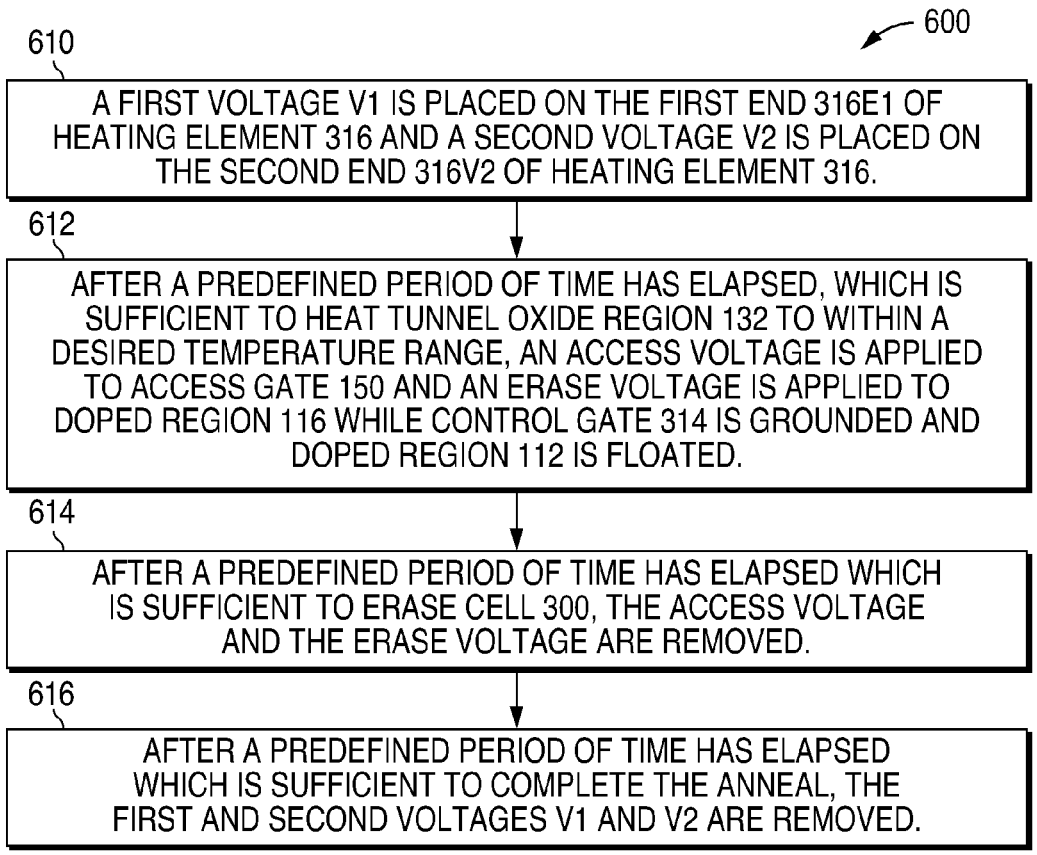
FIG. 6 is a flow chart illustrating an example of an alternate method 600 of erasing FLOTOX EEPROM cell 300 in accordance with the present invention.

Alternately, rather than generating heat after erasure, heat can be generated before erasure begins, maintained throughout the erasure, and removed as above after the anneal is complete. FIG. 6 shows a flow chart that illustrates an example of an alternate method 600 of erasing FLOTOX EEPROM cell 300 in accordance with the present invention.

As shown in FIG. 6, method 600 begins in 610 by placing the first voltage V1 on the first end 316E1 of heating element 316 and the second voltage V2 on the second end 316E2 of heating element 316 where the difference in voltage V1−V2 induces a current to flow through heating element 316 that generates heat.

Next, method 600 moves to 612 where, after a predefined period of time has elapsed, which is sufficient to heat tunnel oxide region 132 to within a desired temperature range, an access voltage is applied to access gate 150 and an erase voltage is applied to doped region 116 while grounding control gate 314 and floating doped region 112.

Under these bias conditions, electrons from floating gate 310 tunnel back through tunnel oxide region 132 to doped region 114 where the reduced negative charge on floating gate 310 lowers the threshold voltage of the cell. The presence of heat during erasure reduces the minimum magnitudes of the erase voltages that can be used.

Following this, method 600 moves to 614 where, after a predefined period of time has elapsed which is sufficient to erase cell 300, the access voltage and the erase voltage is removed. Once the access voltage and the erase voltage have been removed, the localized heat anneals tunnel oxide region 132 which, in turn, repairs damage that was caused to tunnel oxide region 132 by charge carriers (electrons) tunneling through tunnel oxide region 132 during erasing.

After this, method 600 moves to 616 where, after a predefined period of time has elapsed which is sufficient to complete the anneal, the first and second voltages V1 and V2 are removed. The removal of the first and second voltages V1 and V2 stops the current from flowing through heating element 316 which, in turn, removes the source of heat.

Figure 7:
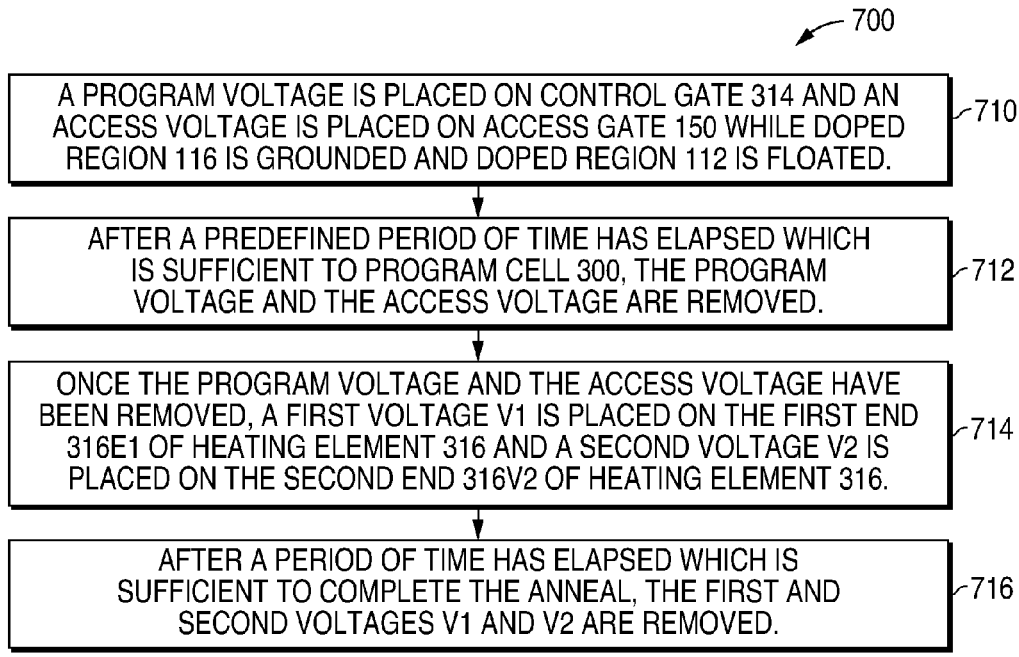
FIG. 7 is a flow chart illustrating an example of a method 700 of programming FLOTOX EEPROM cell 300 in accordance with the present invention.

FIG. 7 shows a flow chart that illustrates an example of a method 700 of programming FLOTOX EEPROM cell 300 in accordance with the present invention. As shown in FIG. 7, method 700 begins in 710 by placing a program voltage, such as +12V, on control gate 314 and an access voltage, such as +3.3V, on access gate 150 while grounding doped region 116 and floating doped region 112.

Under these bias conditions, electrons from doped region 114 tunnel through tunnel oxide region 132 by way of the Fowler-Nordheim tunneling mechanism, and begin accumulating on floating gate 310 where the increased negative charge raises the threshold voltage of the cell. Method 700 next moves to 712 where, after a predefined period of time has elapsed which is sufficient to program cell 300, the program voltage and the access voltage are removed.

Following this, method 700 moves to 714 where, once the program voltage and the access voltage have been removed, a first voltage V1 is placed on the first end 316E1 of heating element 316 and a second voltage V2 is placed on the second end 316E2 of heating element 316. As before, the difference in voltage V1–V2 induces a current to flow through heating element 316 which generates heat as the current density is increased. The sharply increased temperature is coupled to thin tunnel oxide region 132 where the heat anneals tunnel oxide region 132 which, in turn, repairs the damage that was caused to tunnel oxide region 132 by charge carriers (electrons) tunneling through tunnel oxide region 132 during programming.

After this, method 700 moves to 716 where, after a period of time has elapsed which is sufficient to complete the anneal, the first and second voltages V1 and V2 are removed. The removal of the first and second voltages V1 and V2 stops the current from flowing through heating element 316 which, in turn, removes the source of heat.

Figure 8:
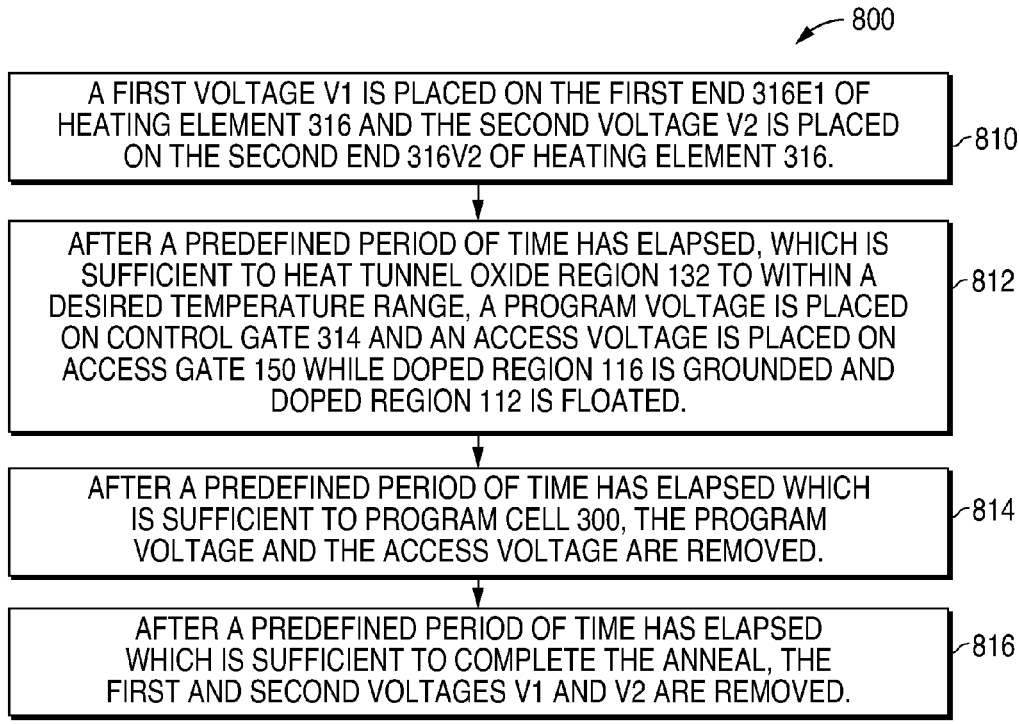
FIG. 8 is a flow chart illustrating an example of an alternate method 800 of programming FLOTOX EEPROM cell 300 in accordance with the present invention.

Alternately, rather than generating heat after programming, heat can be generated before programming begins, maintained throughout the programming, and removed as above after the anneal is complete. FIG. 8 shows a flow chart that illustrates an example of an alternate method 800 of programming FLOTOX EEPROM cell 300 in accordance with the present invention.

As shown in FIG. 8, method 800 begins in 810 by placing the first voltage V1 on the first end 316E1 of heating element 316 and the second voltage V2 on the second end 316E2 of heating element 316 where the difference in voltage V1–V2 induces a current to flow through heating element 316 to generate heat.

Next, method 800 moves to 812 where, after a predefined period of time has elapsed, which is sufficient to heat tunnel oxide region 132 to within a desired temperature range, a program voltage, such as +12V, is placed on control gate 314 and an access voltage, such as +3.3V, is placed on access gate 150 while grounding doped region 116 and floating doped region 112.

Under these bias conditions, electrons from doped region 114 tunnel through tunnel oxide region 132 by way of the Fowler-Nordheim tunneling mechanism, and begin accumulating on floating gate 310 where the increased negative charge raises the threshold voltage of the cell. The presence of heat during programming reduces the minimum magnitude of the program voltage that can be used.

Method 800 next moves to 814 where, after a predefined period of time has elapsed which is sufficient to program cell 300, the program voltage and the access voltage are removed. Once the program voltage and the access voltage have been removed, the localized heat anneals tunnel oxide region 132 which, in turn, repairs damage that was caused to tunnel oxide region 132 by charge carriers (electrons) tunneling through tunnel oxide region 132 during programming.

After this, method 800 moves to 816 where, after a predefined period of time has elapsed which is sufficient to complete the anneal, the first and second voltages V1 and V2 are removed. The removal of the first and second voltages V1 and V2 stops the current from flowing through heating element 316 which, in turn, removes the source of heat.

Once programmed or erased, cell 300 is read by applying a first read voltage, such as +3.3V, to control gate 314, the access voltage to access gate 150, and a second read voltage, such as +3.3V, to doped region 116 while grounding doped region 112. When cell 300 is erased, a large current flows from doped region 116 to doped region 114 to doped region 112 due to the lower threshold voltage of an erased cell, while a much smaller current or no current at all flows from doped region 116 to doped region 114 to doped region 112 when cell 300 is programmed due to the higher threshold voltage of a programmed cell.

FIGS. 9A-9D shows views that illustrate an example of a FLOTOX EEPROM cell 900, which represents a second embodiment of an NVM in accordance with the present invention. FIG. 9A shows a plan view, while FIGS. 9B, 9C, and 9D show cross-sectional views taken along lines 9B-9B, 9C-9C, and 9D-9D of FIG. 9A. FLOTOX EEPROM cell 900 is similar to FLOTOX EEPROM cell 300 and, as a result, utilizes the same reference numerals to designate the structures which are common to both EEPROMS.

FLOTOX EEPROM cell 900 differs from FLOTOX EEPROM cell 300 in that cell 900 includes a buried isolation layer 910, and deep trench isolation regions 912 which extend down through p-semiconductor material 110 to contact buried isolation layer 910 and form an isolated p-semiconductor region 914. Semiconductor region 914 can optionally be only partially isolated (no buried isolation layer 910) as discussed in U.S. Pat. No. 5,761,126 issued on Jun. 2, 1998, which is hereby incorporated by reference. Further, doped regions 112, 114, and 116 can be formed in p-semiconductor material 110, or an isolated p-semiconductor region.

In FLOTOX EEPROM cell 900, isolated p-semiconductor region 914 functions as the control gate. In addition, FLOTOX EEPROM cell 900 operates the same as FLOTOX EEPROM cell 300 except that the voltages placed on control gate 314 are instead placed on isolated p-semiconductor region 914.

Further, FLOTOX EEPROM cell 900 is formed following the same fabrication sequence that is used to form FLOTOX EEPROM cell 300, except that control gate 314 is omitted, and buried isolation layer 910 is first formed using, for example, the well-known SIMOX process. Buried isolation layer 910 and isolated p-semiconductor region 914 can also be formed as part of a well-known silicon-on-insulator (SOI) structure. Further, deep trench isolation regions 912 are formed using well-known deep trench fabrication sequences FIGS. 10A-10D shows views that illustrate an example of a flash EPROM cell 1000, which represents a third embodiment of an NVM in accordance with the present invention. FIG. 10A shows a plan view, while FIGS. 10B, 10C, and 10D show cross-sectional views taken along lines 10B-10B, 10C-10C, and 10D-10D of FIG. 10A. Flash EPROM cell 1000 is similar to flash EPROM cell 200 and, as a result, utilizes the same reference numerals to designate the structures which are common to both EPROMS.

Flash EPROM 1000 differs from flash EPROM 1000 in that flash EPROM 1000 includes a floating gate 1010 that extends out over and is insulated from p-semiconductor material 210, and an interpoly dielectric 1012 that contacts the top surface of floating gate 1010. Floating gate 1010, which is conductive, is electrically isolated from all other conductive structures.

In addition, flash EPROM 1000 includes a control gate 1014 that lies over and is insulated from floating gate 1010 by interpoly dielectric 1012 such that control gate 1014 does not lie directly over any portion of channel region 216. Floating gate 1010 and control gate 1014, which is conductive, can be implemented with, for example, polysilicon.

In accordance with the present invention, flash EPROM 1000 also includes a heating element 1016 that is thermally coupled to thin gate dielectric 220 to generate heat that falls within a temperature range that is sufficient to anneal thin gate dielectric 220. Heating element 1016, which lies over and is insulated from floating gate 1010 by interpoly dielectric 1012, has a first end 1016E1 and an opposing second end 1016E2. Further, heating element 1016, which is conductive and lies below the lowest metal trace, can be implemented as a doped strip of polysilicon, single-crystal silicon, or other material which generates heat when a current is passed through the material.

Figure 11:
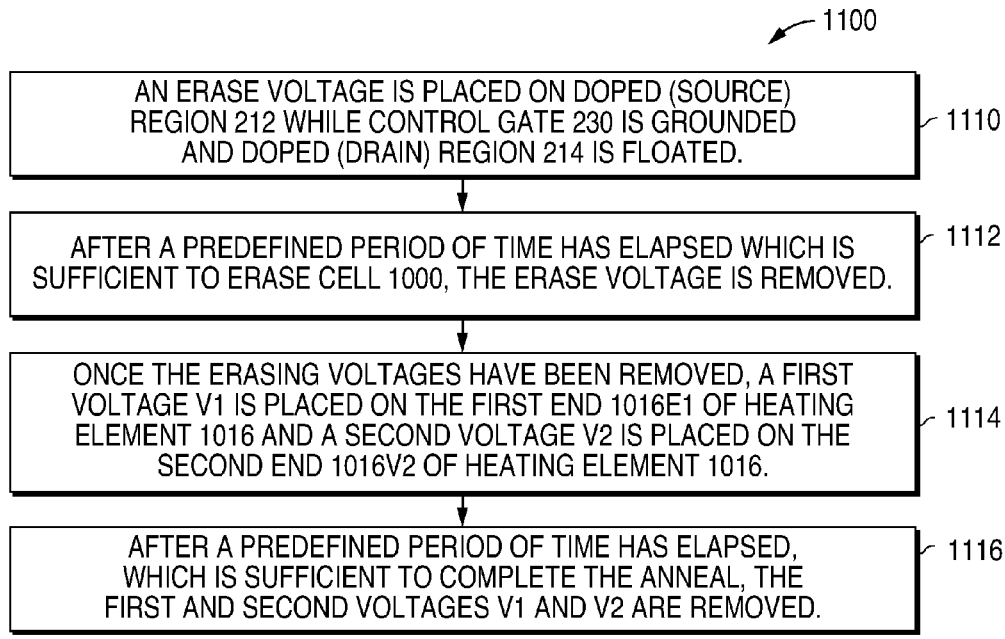
FIG. 11 is a flow chart illustrating an example of a method 1100 of erasing flash EPROM 1000 in accordance with the present invention.

FIG. 11 shows a flow chart that illustrates an example of a method 1100 of erasing flash EPROM 1000 in accordance with the present invention. As shown in FIG. 11, method 1100 begins in 1110 by placing an erase voltage, such as +12V, on doped (source) region 212 while grounding control gate 1014 and floating doped (drain) region 214.

Under these bias conditions, electrons from floating gate 1010 tunnel through gate dielectric 220 to doped region 212 where the reduced negative charge on floating gate 1010 lowers the threshold voltage of the EPROM 1000. Method 1100 next moves to 1112 where, after a predefined period of time has elapsed which is sufficient to erase cell 1000, the erase voltage is removed.

Following this, method 1100 moves to 1114 where, once the erase voltage has been removed, a first voltage V1 is placed on the first end 1016E1 of heating element 1016 and a second voltage V2 is placed on the second end 1016E2 of heating element 1016. The difference in voltage V1–V2 induces a current to flow through heating element 1016 which generates heat as the current density is increased. The heat is thermally coupled to thin gate dielectric 220, causing the temperature of gate dielectric 220 to rise significantly. The sharply increased temperature anneals gate dielectric 220 which, in turn, repairs the damage that was caused by charge carriers (electrons) tunneling through gate dielectric 220 during erasure.

After a predefined period of time has elapsed, which is sufficient to complete the anneal, the first and second voltages V1 and V2 are removed. The removal of the first and second voltages V1 and V2 stops the current from flowing through heating element 1016 which, in turn, removes the source of heat.

Figure 12:
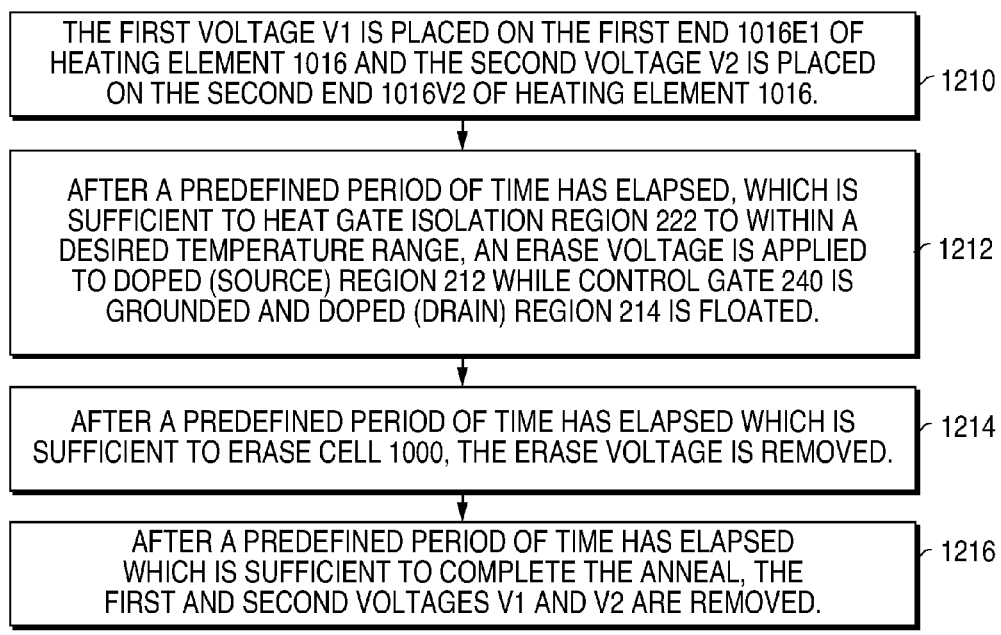
FIG. 12 is a flow chart illustrating an example of an alternate method 1200 of erasing flash EPROM 1200 in accordance with the present invention.

Alternately, rather than generating heat after erasure, heat can be generated before erasure begins, maintained throughout the erasure, and removed as above after the anneal is complete. FIG. 12 shows a flow chart that illustrates an example of an alternate method 1200 of erasing flash EPROM 1200 in accordance with the present invention.

As shown in FIG. 12, method 1200 begins in 1210 by placing the first voltage V1 on the first end 1016E1 of heating element 1016 and the second voltage V2 on the second end 1016E2 of heating element 1016 where the difference in voltage V1–V2 induces a current to flow through heating element 1016 to generate heat.

Next, method 1200 moves to 1212 where, after a predefined period of time has elapsed, which is sufficient to heat gate dielectric 220 to within a desired temperature range, an erase voltage is applied to doped (source) region 212 while grounding control gate 1014 and floating doped (drain) region 214.

Under these bias conditions, electrons from floating gate 1010 tunnel through gate dielectric 220 to doped (source) region 212 where the reduced negative charge on floating gate 1010 lowers the threshold voltage of the EPROM. The presence of heat during erasure reduces the minimum magnitudes of the erase voltages that can be used.

Following this, method 1200 moves to 1214 where, after a predefined period of time has elapsed which is sufficient to erase cell 1000, the erase voltage is removed. Once the erase voltage has been removed, the localized heat anneals gate dielectric 220 which, in turn, repairs damage that was caused to gate dielectric 220 by charge carriers (electrons) tunneling through gate dielectric 220 during erasing.

After this, method 1200 moves to 1216 where, after a predefined period of time has elapsed which is sufficient to complete the anneal, the first and second voltages V1 and V2 are removed. The removal of the first and second voltages V1 and V2 stops the current from flowing through heating element 1016 which, in turn, removes the source of heat.

Flash EPROM 1000 is programmed in the same way that flash EPROM 200 is programmed (i.e., via hot electron injection). In addition, flash EPROM 1000 is also read in the same way that flash EPROM 200 is read. Further, flash EPROM 1000 is formed following the same fabrication sequence that is used to form prior-art flash EPROM 200, except that floating gate 1010 is longer, and the mask which is formed and patterned on a second layer of polysilicon (poly2) to define control gate 1014 is also patterned to define heating element 1016. Thus, when the poly2 layer is etched to form control gate 1014, heating element 1016 is also formed at the same time.

Figure 13B:
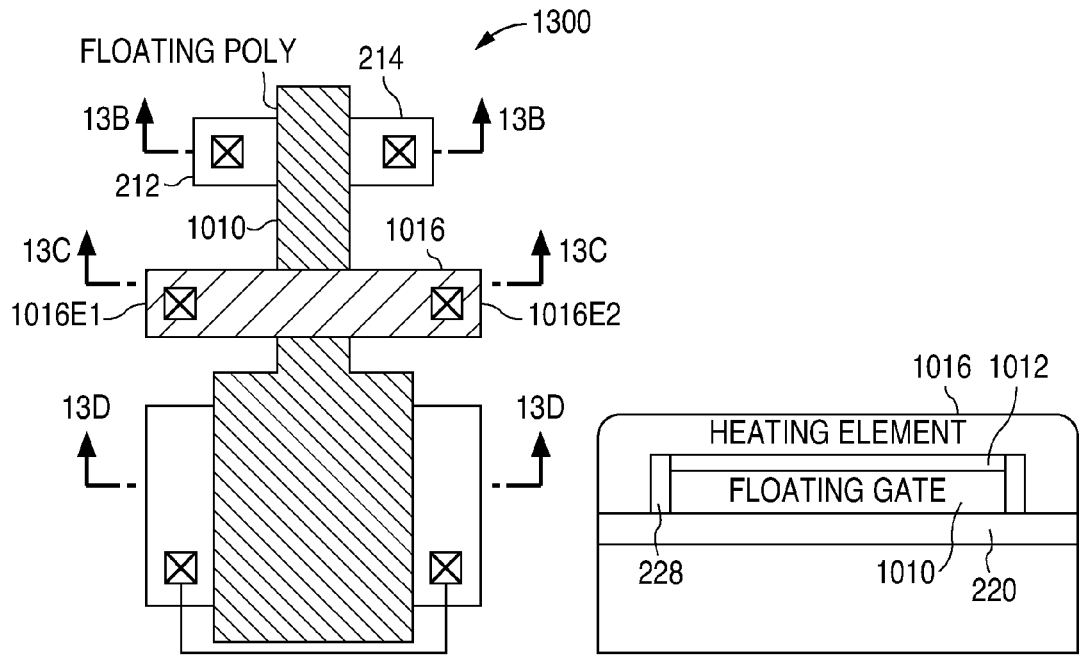
Figure 13B:
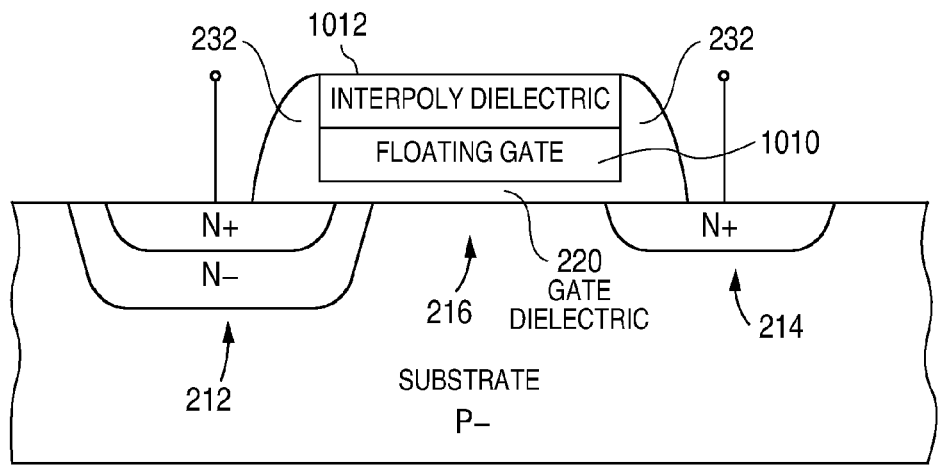
Figure 13D:
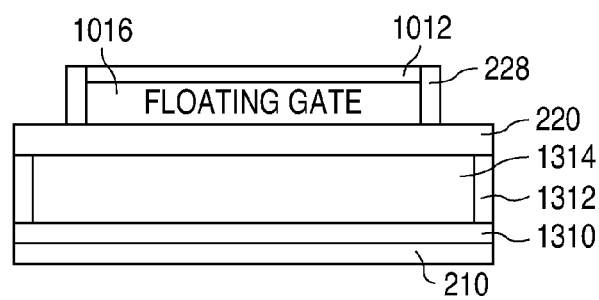

FIGS. 13A-13D shows views that illustrate an example of a flash EPROM 1300, which represents a fourth embodiment of an NVM in accordance with the present invention. FIG. 13A shows a plan view, while FIGS. 13B, 13C, and 13D show cross-sectional views taken along lines 13B-13B, 13C-13C, and 13D-13D of FIG. 13A. Flash EPROM 1300 is similar to flash EPROM 1000 and, as a result, utilizes the same reference numerals to designate the structures which are common to both EEPROMS.

Flash EPROM 1300 differs from flash EPROM 1000 in that EPROM 1300 includes a buried isolation layer 1310, and deep trench isolation regions 1312 which extend down through p-semiconductor material 210 to contact buried isolation layer 1310 and form an isolated p-semiconductor region 1314. Semiconductor region 1314 can optionally be only partially isolated (no buried isolation layer 1310). Further, doped regions 212 and 214 can be formed in p-semiconductor material 210, or an isolated p-semiconductor region.

In flash EPROM 1300, isolated p-semiconductor region 1314 functions as the control gate. In addition, flash EPROM 1300 operates the same as flash EPROM 1000 except that the voltages placed on control gate 1014 are instead placed on isolated p-semiconductor region 1314.

Further, flash EPROM 1300 is formed following the same fabrication sequence that is used to form flash EPROM 1000, except that poly2 control gate 1014 is omitted, and buried isolation layer 1310 is first formed using, for example, the SIMOX process. Buried isolation layer 1310 and isolated p-semiconductor region 1314 can also be formed as part of a silicon-on-insulator (SOI) structure. Further, deep trench isolation regions 1312 are formed using well-known deep trench fabrication sequences.

FIGS. 14A-14C shows views that illustrate an example of an EEPROM 1400, which represents a fifth embodiment of an NVM in accordance with the present invention. FIG. 14A shows a plan view, while FIGS. 14B and 14C are cross-sectional views taken along lines 14B-14B and 14C-14C of FIG. 14A. EEPROM 1400 is similar to flash EPROM 1300 and, as a result, utilizes the same reference numerals to designate the structures which are common to both devices.

EEPROM 1400 differs from flash EPROM 1300 in that EPROM 1400 includes an isolation region 1408 that lies over channel region 216, and also contacts the top surface of isolated p-semiconductor region 1314. In addition, EEPROM 1400 also includes a heating element 1410 that contacts and is thermally coupled to isolation region 1408 to generate heat that falls within a temperature range that is sufficient to anneal isolation region 1408. Heating element 1410, which lies over isolated p-semiconductor region 1314, has a first end 1410E1 and an opposing second end 1410E2. Further, heating element 1410, which lies below the lowest metal trace, can be implemented as a doped strip of polysilicon, single-crystal silicon, or other material which generates heat when a current is passed through the material.

Further, EEPROM 1400 includes a conductive control gate 1412 that lies over and is isolated from isolated p-semiconductor region 1314 by isolation region 1408. In flash EPROM 1300, isolated p-semiconductor region 1314 functions as the control gate. In contrast, EEPROM 1400 utilizes isolated p-semiconductor region 1314 as a charge storage region.

Figure 15:
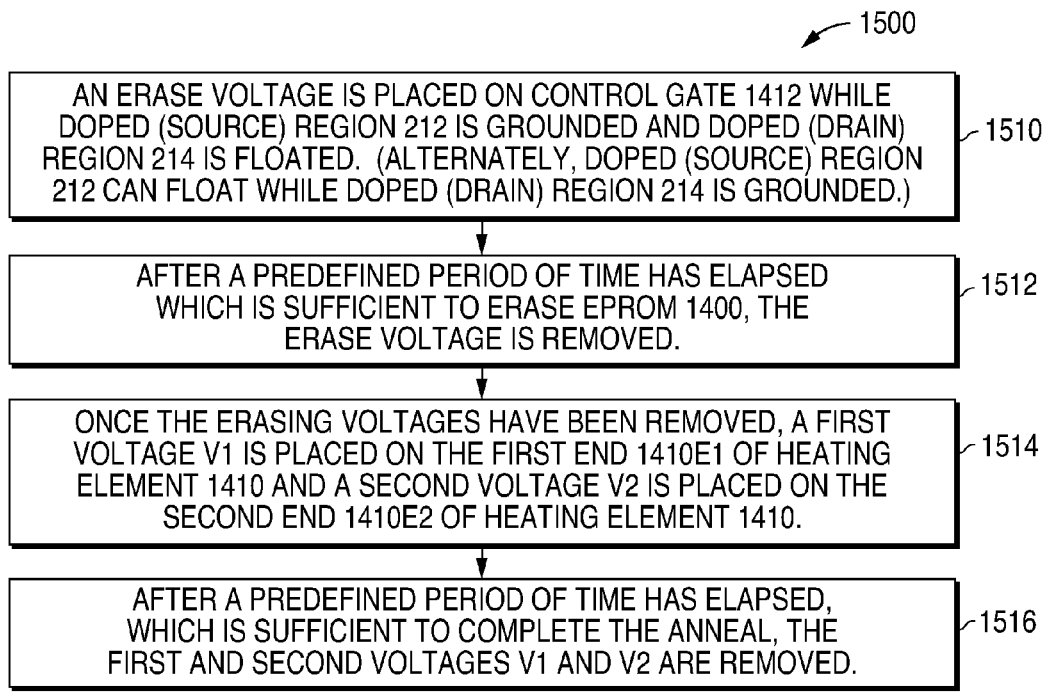
FIG. 15 is a flow chart illustrating an example of a method 1500 of erasing EPROM 1400 in accordance with the present invention.

FIG. 15 shows a flow chart that illustrates an example of a method 1500 of erasing EPROM 1400 in accordance with the present invention. As shown in FIG. 15, method 1500 begins in 1510 by placing an erase voltage, such as +12V, on control gate 1412 while grounding doped (source) region 212 and floating doped (drain) region 214. (Alternately, doped (source) region 212 can float while doped (drain) region 214 is grounded.)

Under these bias conditions, electrons from isolated p-semiconductor region 1314 tunnel through isolation region 1408 by way of the Fowler-Nordheim tunneling mechanism to control gate 1412 where the reduced negative charge on isolated p-semiconductor region 1314 increases the potential on isolated p-semiconductor region 1314. The potential on isolated p-semiconductor region 1314 is coupled to floating gate 1010 which raises the potential on floating gate 1010. Raising the potential on floating gate 1010 lowers the threshold voltage of EEPROM 1400. Method 1500 next moves to 1512 where, after a predefined period of time has elapsed which is sufficient to erase EPROM 1400, the erase voltage is removed.

Following this, method 1500 moves to 1514 where, once the erase voltage has been removed, a first voltage V1 is placed on the first end 1410E1 of heating element 1410 and a second voltage V2 is placed on the second end 1410E2 of heating element 1410. The difference in voltage V1–V2 induces a current to flow through heating element 1410 which generates heat as the current density is increased. The heat is thermally coupled to isolation region 1408, causing the temperature of isolation region 1408 to rise significantly. The sharply increased temperature anneals isolation region 1408 which, in turn, repairs the damage that was caused by charge carriers (electrons) tunneling through isolation region 1408 during erasure.

After a predefined period of time has elapsed, which is sufficient to complete the anneal, the first and second voltages V1 and V2 are removed. The removal of the first and second voltages V1 and V2 stops the current from flowing through heating element 1410 which, in turn, removes the source of heat.

Figure 16:
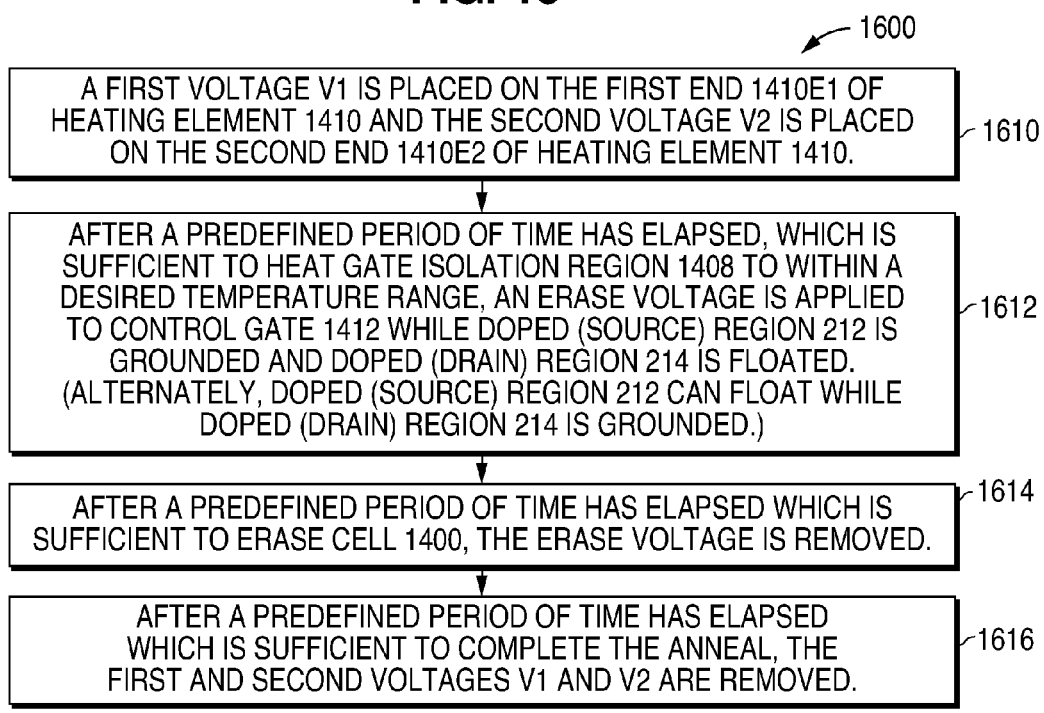
FIG. 16 is a flow chart illustrating an example of an alternate method 1600 of erasing EPROM 1500 in accordance with the present invention.

Alternately, rather than generating heat after erasure, heat can be generated before erasure begins, maintained throughout the erasure, and removed as above after the anneal is complete. FIG. 16 shows a flow chart that illustrates an example of an alternate method 1600 of erasing EPROM 1500 in accordance with the present invention.

As shown in FIG. 16, method 1600 begins in 1610 by placing the first voltage V1 on the first end 1410E1 of heating element 1410 and the second voltage V2 on the second end 1410E2 of heating element 1410 where the difference in voltage V1–V2 induces a current to flow through heating element 1410 to generate heat.

Next, method 1600 moves to 1612 where, after a predefined period of time has elapsed, which is sufficient to heat isolation region 1408 to within a desired temperature range, an erase voltage is placed on control gate 1412 while grounding doped (source) region 212 and floating doped (drain) region 214.

Under these bias conditions, electrons from isolated p-semiconductor region 1314 tunnel through isolation region 1408 by way of the Fowler-Nordheim tunneling mechanism to control gate 1412 where the reduced negative charge on isolated p-semiconductor region 1314 increases the potential on isolated p-semiconductor region 1314. The potential on isolated p-semiconductor region 1314 is coupled to floating gate 1010 which raises the potential on floating gate 1010. Raising the potential on floating gate 1010 lowers the threshold voltage of EEPROM 1400. The presence of heat during erasure reduces the minimum magnitudes of the erase voltage that can be used.

Following this, method 1600 moves to 1614 where, after a predefined period of time has elapsed which is sufficient to erase cell 1400, the erase voltage is removed. Once the erase voltage has been removed, the localized heat anneals isolation region 1408 which, in turn, repairs damage that was caused to isolation region 1408 by charge carriers (electrons) tunneling through isolation region 1408 during erasing.

After this, method 1600 moves to 1616 where, after a predefined period of time has elapsed which is sufficient to complete the anneal, the first and second voltages V1 and V2 are removed, either immediately or gradually. The removal of the first and second voltages V1 and V2 stops the current from flowing through heating element 1410 which, in turn, removes the source of heat.

Figure 17:
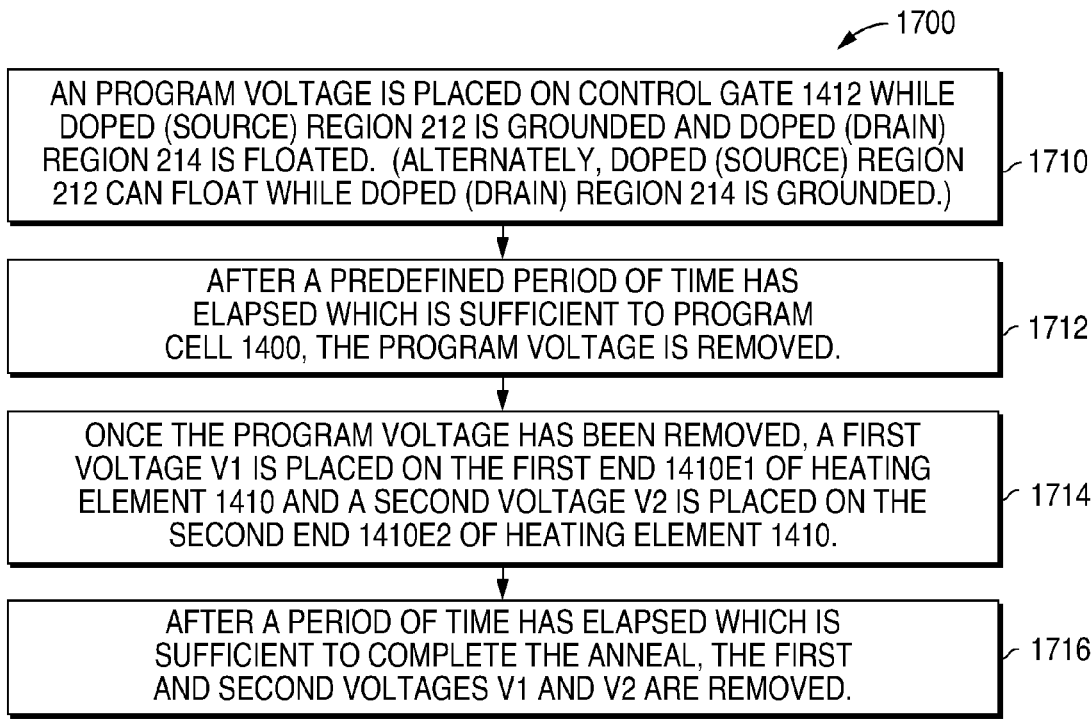
FIG. 17 is a flow chart illustrating an example of a method 1700 of programming EEPROM 1400 in accordance with the present invention.

FIG. 17 shows a flow chart that illustrates an example of a method 1700 of programming EEPROM 1400 in accordance with the present invention. As shown in FIG. 17, method 1700 begins in 1710 by placing a program voltage, such as −12V, on control gate 1412, while grounding doped (source) region 212 and floating doped (drain) region 214. (Alternately, doped (source) region 212 can float while doped (drain) region 214 is grounded.)

Under these bias conditions, electrons from control gate 1412 tunnel through isolation region 1408 to isolated p-semiconductor region 1314 by way of the Fowler-Nordheim tunneling mechanism, and begin accumulating in isolated p-semiconductor region 1314 where the increased negative charge lowers the potential on isolated p-semiconductor region 1314. The potential on isolated p-semiconductor region 1314 is coupled to floating gate 1010 which lowers the potential on floating gate 1010. Lowering the potential on floating gate 1010 raises the threshold voltage of the cell. Method 1700 next moves to 1712 where, after a predefined period of time has elapsed which is sufficient to program cell 1400, the program voltage is removed.

Following this, method 1700 moves to 1714 where, once the program voltage has been removed, a first voltage V1 is placed on the first end 1410E1 of heating element 1410 and a second voltage V2 is placed on the second end 1410E2 of heating element 1410. As before, the difference in voltage V1–V2 induces a current to flow through heating element 1410 which generates heat as the current density is increased. The heat is thermally coupled to isolation region 1408, causing the temperature of isolation region 1408 to rise significantly. The sharply increased temperature anneals isolation region 1408 which, in turn, repairs the damage that was caused to isolation region 1408 by charge carriers (electrons) tunneling through isolation region 1408 during programming.

After this, method 1700 moves to 1716 where, after a period of time has elapsed which is sufficient to complete the anneal, the first and second voltages V1 and V2 are removed. The removal of the first and second voltages V1 and V2 stops the current from flowing through heating element 1410 which, in turn, removes the source of heat.

Figure 18:
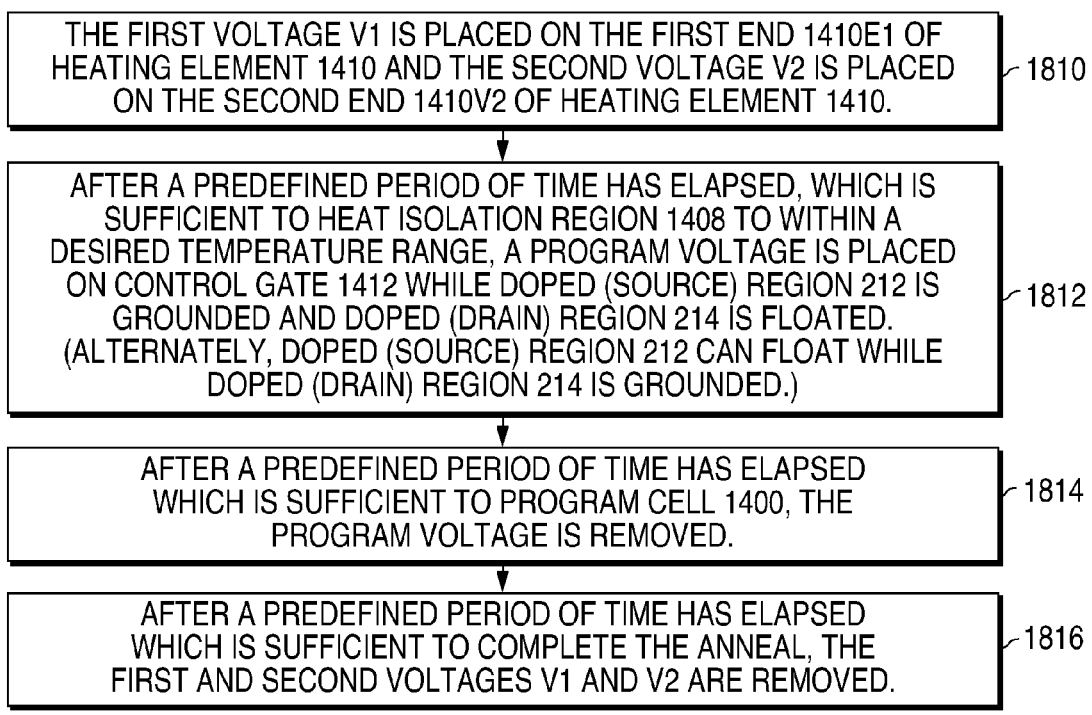
FIG. 18 is a flow chart illustrating an example of an alternate method 1800 of programming EEPROM 1400 in accordance with the present invention.

Alternately, rather than generating heat after programming, heat can be generated before programming begins, maintained throughout the programming, and removed as above after the anneal is complete. FIG. 18 shows a flow chart that illustrates an example of an alternate method 1800 of programming EEPROM 1400 in accordance with the present invention.

As shown in FIG. 18, method 1800 begins in 1810 by placing the first voltage V1 on the first end 1410E1 of heating element 1410 and the second voltage V2 on the second end 1410E2 of heating element 1410 where the difference in voltage V1–V2 induces a current to flow through heating element 1410 to generate heat.

Next, method 1800 moves to 1812 where, after a predefined period of time has elapsed, which is sufficient to heat isolation region 1408 to within a desired temperature range, a program voltage, such as –12V, is placed on control gate 1412 while grounding doped region 212 and floating doped region 214.

Under these bias conditions, electrons from control gate 1412 tunnel through isolation region 1408 to isolated p-semiconductor region 1314 by way of the Fowler-Nordheim tunneling mechanism, and begin accumulating in isolated p-semiconductor region 1314 where the increased negative charge lowers the potential on isolated p-semiconductor region 1314. The potential on isolated p-semiconductor region 1314 is coupled to floating gate 1010 which lowers the potential on floating gate 1010. Lowering the potential on floating gate 1010 raises the threshold voltage of the cell. The presence of heat during programming reduces the minimum magnitude of the program voltage that can be used.

Method 1800 next moves to 1814 where, after a predefined period of time has elapsed which is sufficient to program cell 1400, the program voltage is removed. Once the program voltage has been removed, the localized heat anneals isolation region 1408 which, in turn, repairs damage that was caused to isolation region 1408 by charge carriers (electrons) tunneling through isolation region 1408 during programming.

After this, method 1800 moves to 1816 where, after a predefined period of time has elapsed which is sufficient to complete the anneal, the first and second voltages V1 and V2 are removed, either immediately or gradually. The removal of the first and second voltages V1 and V2 stops the current from flowing through heating element 1410 which, in turn, removes the source of heat.

In addition to placing the programming voltage on control gate 1412, the programming voltage can also be applied to heating element 1410. For example, the current can be generated by using third and fourth voltages –V1 and –V2 in lieu of first and second voltages V1 and V2. When a programming voltage –Vp, such as –12V, is applied to control gate 1412, the programming voltage –Vp can also be applied to heating element 1410. Thus, the current I is defined by (–Vp–V1)–(–Vp–V2). As a result, electrons tunnel to isolated p-semiconductor region 1314 from heating element 1410 in the same way that electrons tunnel from control gate 1412 to isolated p-semiconductor region 1314.

Similarly, in addition to placing the erase voltage on control gate 1412, the erase voltage can also be applied to heating element 1410. For example, the current is defined by V1–V2. When an erase voltage +Vp, such as +12V, is applied to control gate 1412, the erase voltage +Vp can also be applied to heating element 1410. Thus, the current I is defined by (+Vp+V1)–(+Vp+V2). As a result, electrons tunnel from isolated p-semiconductor region 1314 to heating element 1410 in the same way that electrons tunnel to control gate 1412 from isolated p-semiconductor region 1314.

Once programmed or erased, cell 1400 is read by applying a first read voltage, such as +3.3V, to control gate 1412, and a second read voltage, such as +3.3V, to doped (drain) region 214 while grounding doped (source) region 212. When cell 1400 is erased, a large current flows from doped (drain) region 214 to doped (source) region 212 due to the lower threshold voltage of an erased EEPROM, while a much smaller current or no current at all flows from doped region 214 to doped region 212 when cell 1400 is programmed due to the higher threshold voltage of a programmed EEPROM.

Further, EEPROM 1400 is formed following the same fabrication sequence that is used to form flash EPROM 1300, except that poly2 heating element 1016 is omitted, and the mask which is formed and patterned on a first layer of polysilicon (poly1) to define floating gate 1010 is also patterned to define heating element 1410 and control gate 1412. Thus, when the poly1 layer is etched to form floating gate 1010, heating element 1410 and control gate 1412 are also formed at the same time.

FIGS. 19A-19D shows views that illustrate an example of an EPROM 1900, which represents a sixth embodiment of an NVM in accordance with the present invention. FIG. 19A shows a plan view, while FIGS. 19B, 19C, and 19D show cross-sectional views taken along lines 19B-19B, 19C-19C, and 19D-19D of FIG. 19A. Flash EPROM 1900 is similar to flash EPROM 1000 and, as a result, utilizes the same reference numerals to designate the structures which are common to both EEPROMS.

Flash EPROM 1900 differs from flash EPROM 1000 in that EPROM 1900 includes a thin isolation region 1910 that contacts and lies between floating gate 1010 and control gate 1014 in lieu of interpoly dielectric 1012, and a gate dielectric 1912 in lieu of gate dielectric 220. Gate dielectric 1912 is thicker than gate dielectric 220 and isolation region 1910.

Flash EPROM 1900 operates the same as EEPROM 14000 (methods 1500, 1600, 1700, and 1800) except that the voltages placed on control gate 1412 are placed on control gate 1014, and the voltages placed on heating element 1410 are placed on heating element 1016. In this case, programming and erasing occur with charge carriers (electrons) tunneling through thin isolation region 1910 that contacts and lies between floating gate 1010 and control gate 1014. Further, flash EPROM 1900 is formed following the same fabrication sequence that is used to form flash EPROM 1000, except for using, for example, an oxide in lieu of interpoly dielectric 1012, and a thicker gate dielectric.

In addition, flash EPROM 1300 can be operated the same as EEPROM 14000 (methods 1500, 1600, 1700, and 1800) except that the voltages placed on control gate 1412 are placed on isolated p-semiconductor region 1314, and the voltages placed on heating element 1410 are placed on heating element 1016. In this case, programming and erasing occur with charge carriers (electrons) tunneling through the gate dielectric 220 that contacts and lies between floating gate 1010 and isolated p-semiconductor region 1314.

In an alternative embodiment of the present invention, the thermal heat coupling can be improved by removing a region of silicon from underneath the heating element and the floating gate, such as by forming a back side opening. Alternately, an SOI structure, such as silicon on sapphire, can be utilized which has poor thermal conductivity.

Thus, examples of a non-volatile memory (NVM) that can be programmed and erased a large number of times have been described. In the present invention, the NVMS utilize a localized heating element that anneals the oxide that is damaged by tunneling charge carriers when the NVM is programmed and erased. In addition, the program and erase voltages can also be reduced when heat from the heating element is applied prior to programming and erasing.

It should be understood that the above descriptions are examples of the present invention, and that various alternatives of the invention described herein may be employed in practicing the invention. For example, in addition to erasing to the source, drain, and control gate, a floating gate can also be erased to a well as discussed in U.S. Pat. No. 6,137,723 issued on Oct. 24, 2000, which is hereby incorporated by reference. In addition, although each memory was shown with a single heating element, more than one heating element can be used with each memory. Thus, it is intended that the following claims define the scope of the invention and that structures and methods within the scope of these claims and their equivalents be covered thereby.

What is claimed is:

1. A semiconductor memory formed in a semiconductor material of a first conductivity type, the semiconductor memory comprising:
    a first doped region of a second conductivity type that touches the semiconductor material;
    a second doped region of the second conductivity type that touches the semiconductor material, the first and second doped regions being spaced apart;
    a channel region of the semiconductor material that lies between and touches the first and second doped regions;
    a non-conductive region that touches and lies directly over the channel region;
    a floating gate that touches the non-conductive region, the floating gate being conductive, lying directly over the channel region, being electrically isolated from all other conductive structures; and
    a heating element that touches the non-conductive region and lies adjacent to and spaced apart from the floating gate, the heating element being conductive and generating heat in response to a current flowing through the heating element, no part of the heating element lying directly over the channel region.

2. The semiconductor memory of claim 1 wherein the heating element lies horizontally adjacent to the floating gate.

3. The semiconductor memory of claim 1 wherein the heating element lies vertically adjacent to the floating gate.

4. The semiconductor memory of claim 1 and further comprising a control gate region of the semiconductor material that touches the non-conductive region, and lies directly below the floating gate, the control gate region being conductive, and spaced apart from the first doped region, the second doped region, and the channel region.

5. The semiconductor memory of claim 4 wherein the control gate region is electrically isolated from the semiconductor material.

6. The semiconductor memory of claim 5 wherein the control gate region is electrically isolated from all other conductive structures.

7. The semiconductor memory of claim 4 wherein no part of the heating element lies directly above the control gate region.

8. The semiconductor memory of claim 5 wherein no part of the heating element lies directly above the control gate region.

9. The semiconductor memory of claim 4 wherein a portion of the non-conductive region lies over the second doped region, the portion of the non-conductive region having a first thickness and a second thickness over the second doped region that is less than the first thickness.

10. The semiconductor memory of claim 9 wherein no part of the heating element lies directly above the control gate region.

11. The semiconductor memory of claim 10 wherein the control gate region is electrically isolated from the semiconductor material.

12. The semiconductor memory of claim 11 and further comprising:
    a third doped region of the second conductivity type that touches the semiconductor material, the first, second, and third doped regions being spaced apart;
    a channel section of the semiconductor material that lies between and touches the second and third doped regions; and
    an access gate that lies directly over and isolated from the channel section of the semiconductor material.

13. The semiconductor memory of claim 4 and further comprising a control gate that touches the non-conductive region and lies directly over the control gate region, the control gate being conductive and spaced apart from the heating element and the floating gate, no portion of the control gate lying over the floating gate.

14. A semiconductor memory formed in a semiconductor material of a first conductivity type, the semiconductor memory comprising:
    a first doped region of a second conductivity type that touches the semiconductor material;
    a second doped region of the second conductivity type that touches the semiconductor material, the first and second doped regions being spaced apart;

a channel region of the semiconductor material that lies between and touches the first and second doped regions;

a first non-conductive region that touches and lies over the channel region;

a floating gate that touches the first non-conductive region, the floating gate lying directly over the channel region, being conductive, having a top surface, and being electrically isolated from all other conductive structures;

a second non-conductive region that touches the top surface of the floating gate;

a control gate that touches the first non-conductive region, the control gate lying directly under the floating gate and being conductive; and a heating element that touches the second non-conductive region, the heating element lying directly over the floating gate, being conductive, generating heat in response to a current flowing through the heating element, and being spaced apart from the control gate.

15. The semiconductor memory of claim 14 wherein the control gate has a conductivity type.

16. The semiconductor memory of claim 15 wherein the control gate is electrically isolated from the semiconductor material.

17. The semiconductor memory of claim 16 wherein no portion of the heating element lies directly over the control gate.

18. The semiconductor memory of claim 16 wherein a portion of the first non-conductive region lies over the second doped region, the portion of the non-conductive region having a first thickness and a second thickness over the second doped region that is less than the first thickness.

19. The semiconductor memory of claim 18 and further comprising:

a third doped region of the second conductivity type that touches the semiconductor material, the first, second, and third doped regions being spaced apart;

a channel section of the semiconductor material that lies between and touches the second and third doped regions; and an access gate that lies directly over and isolated from the channel section of the semiconductor material.

* * * * *